(12) United States Patent
Sasaki et al.

(10) Patent No.: US 6,963,518 B2
(45) Date of Patent: Nov. 8, 2005

(54) SEMICONDUCTOR MEMORY HAVING A PULSE GENERATOR FOR GENERATING COLUMN PULSES

(75) Inventors: Junichi Sasaki, Kawasaki (JP); Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 256 days.

(21) Appl. No.: 10/387,398

(22) Filed: Mar. 14, 2003

(65) Prior Publication Data

US 2004/0042334 A1    Mar. 4, 2004

(30) Foreign Application Priority Data

Aug. 29, 2002  (JP) ............... 2002-251850

(51) Int. Cl.[7] .............................................. G11C 8/00
(52) U.S. Cl. ...................... 365/236; 365/233; 365/226; 365/227
(58) Field of Search ................... 365/236, 233, 365/226, 227

(56) References Cited

U.S. PATENT DOCUMENTS

| | | |
|---|---|---|
| 4,961,172 A | 10/1990 | Shubat et al. |
| 5,668,774 A | 9/1997 | Furutani |
| 5,781,500 A | 7/1998 | Oh |
| 5,970,022 A | 10/1999 | Hoang |
| 5,982,703 A | 11/1999 | Oh |
| 6,125,078 A | 9/2000 | Ooishi et al. |
| 6,172,935 B1 * | 1/2001 | Wright et al. ............... 365/233 |
| 6,229,735 B1 | 5/2001 | Akaogi et al. |
| 6,373,783 B1 * | 4/2002 | Tomita ....................... 365/233 |
| 6,529,408 B2 * | 3/2003 | Uchihashi .............. 365/185.08 |
| 2002/0031035 A1 | 3/2002 | Tsuji et al. |
| 2003/0097620 A1 * | 5/2003 | Ohno ........................ 714/700 |

FOREIGN PATENT DOCUMENTS

EP    0 624 879 A1    11/1994

* cited by examiner

Primary Examiner—Connie C. Yoha
(74) Attorney, Agent, or Firm—Arent Fox PLLC

(57) ABSTRACT

A pulse generator generates a plurality of column pulses in response to a read command. An address counter outputs addresses subsequent to an external address supplied in association with the read command in succession as internal addresses. A column decoder successively selects column selecting lines in synchronization with the column pulses. A plurality of bits of data read from memory cells in response to a single read command RD is successively transmitted to a common data bus line through column switches. This can reduce the number of data bus lines to a minimum, preventing an increase in chip size. Since a single data bus line can transmit a plurality of bits of data, it is possible to minimize the size of the memory region to be activated in response to a read command. This consequently allows a reduction in power consumption.

28 Claims, 27 Drawing Sheets

Fig. 25

SEMICONDUCTOR MEMORY HAVING A PULSE GENERATOR FOR GENERATING COLUMN PULSES

CROSS REFERENCE TO RELATED APPLICATION

This application is based upon and claims the benefit of priority from Japanese Patent Application No. 2002-251850, filed on Aug. 29, 2002, the entire contents of which are incorporated herein by reference.

BACKGROUND OF THE INVENTION

1. Field of the Invention

The present invention relates to a semiconductor memory, and more particularly to a technology for reducing power consumption while maintaining high speed operation.

2. Description of the Related Art

In general, semiconductor memories have a page operation function in which data that is read simultaneously from a plurality of memory cells connected to a word line is output in succession. The page operation function can accelerate operations subsequent to the activation of the memory block, with an improvement in data transfer rate.

For yet improved data transfer rate, there has been recently developed a semiconductor memory which has a high speed page operation function in which a plurality of bits of data is simultaneously read and retained into a register or the like in response to a single read command.

FIG. 1 shows an overview of a semiconductor memory having the high speed page operation function of this type.

The semiconductor memory has four memory blocks BLK1–BLK4. The memory blocks BLK1–BLK4 have column decoders CDEC1–CDEC4 for selecting column selecting lines CL1–CL4 in accordance with a column address, precharging units PRE1–PRE4 having precharging circuits for bit lines BL and /BL, sense amplifier units SA1–SA4 having sense amplifiers SA, memory cell arrays ARY1–ARY4 having memory cells MC, amplifier units AMP1–AMP4 having read amplifiers and write amplifiers, and latch units LTCH1–LTCH4 having latch circuits. Word lines WL are laid common to the four memory blocks BLK1–BLK4.

In this semiconductor memory, all the memory blocks BLK1–BLK4 are activated in accordance with a read command. A predetermined word line WL is selected in accordance with a row address which is supplied along with the read command. Next, the sense amplifiers SA of the sense amplifier units SA1–SA4 are activated to amplify data that is read from the memory cells MC to the bit lines BL and /BL. That is, the four memory blocks BLK1–BLK4 are all activated in response to the read command.

Then, the column selecting lines CL1–CL4 are simultaneously selected in accordance with a column address, turning on four column switches CSW. The data amplified by the sense amplifiers SA is transmitted to local data bus lines LDB1–LDB4 through the column switches CSW, respectively. The parallel read data is transmitted from the local data bus lines LDB1–LDB4 to global data bus lines GDB1–GDB4, and further amplified by the read amplifiers of the amplifier units AMP1–AMP4.

The parallel data amplified by the read amplifiers is converted into serial data by a parallel/serial conversion circuit, and output to a data terminal in succession. The number of times the data is output to the data terminal in response to a single read command is referred to as burst length. In this example, the burst length is "4". Each time the semiconductor memory receives a read command, it repeats the above-described operation to perform a read operation.

FIG. 2 shows an overview of another semiconductor memory having the high speed page operation function. The same elements as in FIG. 1 are designated by identical numbers.

The semiconductor memory has four memory blocks BLK1–BLK4. Word lines WL are laid by each of the four memory blocks BLK. Then, in accordance with a row address supplied along with a read command, any one of the memory blocks BLK1–BLK4 is selected (in this example, BLK1) and a word line WL in the selected memory block BLK1 is selected. Next, the sense amplifiers SA of the sense amplifier unit SA1 in the memory block BLK1 are activated to amplify data that is read from the memory cells MC to the bit lines BL and /BL. That is, in this semiconductor memory, any one of the four memory blocks BLK1–BLK4 is activated in response to the read command.

Next, in the selected memory block BLK1, the column selecting lines CL1–CL4 are selected in accordance with a column address so that four column switches CSW are turned on simultaneously. The data amplified by the sense amplifiers SA is transmitted to local data bus lines LDB1–LDB4 in the memory block BLK1 through the column switches CSW, respectively. The parallel read data is transmitted from the local data bus lines LDB1–LDB4 to global data bus lines GDB1–GDB4 in the memory block BLK1, and further amplified by the read amplifiers of the amplifier unit AMP1.

As in FIG. 1, the parallel data amplified by the read amplifiers is converted into serial data by a parallel/serial conversion circuit, and output to a data terminal in succession. In this example, the burst length is also "4". Each time the semiconductor memory receives a read command, it repeats the above-described operation to perform a read operation.

In the semiconductor memory shown in FIG. 1 a problem arises that activation of all the memory blocks BLK during a read operation increases power consumption.

In the semiconductor memory shown in FIG. 2, a single memory block BLK is activated in a read operation. Nevertheless, the global data bus lines GDB1–GDB4 must be laid in each of the memory blocks BLK. Aside from those shown in the diagram, the memory blocks BLK are also provided with power supply lines and the like. Hence, if the wiring regions of the global data bus lines GDB1–GDB4 cannot be secured inside the memory blocks BLK at the stage of layout design, it is necessary to secure the wiring regions of the global data bus lines GDB1–GDB4 by such means as reducing the wiring width of the power supply lines. In this case, power supply noise is likely to occur due to increases in the power supply resistance. When the wiring width of the power supply lines is unchanged, the individual memory blocks BLK must be enlarged in conformity to the wiring regions of the global data bus lines GDB1–GDB4. This results in increasing the semiconductor memory in chip size.

SUMMARY OF THE INVENTION

It is an object of the present invention to provide a semiconductor memory having a high speed page operation function, which achieves reduction in the operating power consumption while maintaining high speed operation.

Another object of the present invention is to provide a semiconductor memory having a high speed page operation function, which achieves reduction in the operating power consumption with no increase in chip size.

According to one of the aspects of the semiconductor memory of the present invention, a pulse generator generates a plurality of column pulses in response to a read command supplied from exterior. An address counter receives an external address supplied in association with the read command, and outputs the external address and addresses subsequent to the external address in succession as internal addresses. A column decoder successively selects, in synchronization with the column pulses, column selecting lines corresponding to the internal addresses, respectively. By the selection of the column selecting lines, column switches are turned on in succession. Data read from memory cells to bit lines is successively transmitted to a common data bus line through the column switches. That is, a plurality of bits of data read from the memory cells in response to a single read command can be transmitted through a single data bus line. As a result, the number of data bus lines can be reduced to a minimum, thereby avoiding an increase in chip size. Moreover, since a single data bus line can transmit a plurality of bits of data, it is possible to minimize the size of the memory region which is activated in response to a read command. This consequently allows a reduction in power consumption.

In response to a single read command and an external address supplied in association with the read command, the plurality of column pulses are generated automatically inside the semiconductor memory. Since a read operation can be performed with a minimum number of signals fed from exterior, it is possible to reduce the power consumption while maintaining high speed operation.

According to another aspect of the semiconductor memory of the present invention, the number of column pulses to be generated by the pulse generator can be set freely by a first mode setting circuit. This makes it possible to configure a plurality of types of semiconductor memories having different data output specifications using a single type of chip. As a result, the semiconductor memory can be improved in development efficiency with a reduction in development cost.

According to another aspect of the semiconductor memory of the present invention, a number control circuit receives a first mode signal for indicating the number of column pulses, and outputs an enable signal until the indicated number of column pulses are all output, the first mode signal being output from the first mode setting circuit. The pulse generator has only to generate the column pulses while the enable signal is output. This achieves simple configuration of the pulse generator.

According to another aspect of the semiconductor memory of the present invention, the first mode setting circuit sets the number of column pluses in accordance with a first setting signal supplied through an external terminal. It is therefore possible to set the number of column pulses in accordance with the specifications of a system in which the semiconductor memory is to be mounted on. In other words, users of the semiconductor memory can set the number of column pulses freely.

According to another aspect of the semiconductor memory of the present invention, a first programming circuit outputs, to the first mode setting circuit, a first internal setting signal for initially setting the number of column pulses to any one of a plurality of predetermined values in the first mode setting circuit. Consequently, the number of column pulses can be surely initialized by the first programming circuit so that the semiconductor memory is prevented from malfunctioning.

According to another aspect of the semiconductor memory of the present invention, the first programming circuit has a first fuse, and outputs the first internal setting signal in accordance with the programming of the first fuse. It is therefore possible to set the number of column pulses in accordance with the product specifications (operating frequency, power consumption, etc.) of the semiconductor memory to be shipped.

According to another aspect of the semiconductor memory of the present invention, the first programming circuit has a first switch made up of a conductive pattern which is formed on a semiconductor substrate in conformity to the pattern configuration of a photomask to be used in a semiconductor fabrication process. The first internal setting signal is output in accordance with a voltage at a destination of the conductive pattern. It is therefore possible to set the number of column pulses in accordance with the product specifications (operating frequency, power consumption, etc.) of the semiconductor memory to be shipped.

According to another aspect of the semiconductor memory of the present invention, the column pulse generation cycle can be set freely by a second mode setting circuit. A plurality of types of semiconductor memories having different timing specifications can thus be made using the single chip. As a result, the semiconductor memory can be improved in development efficiency with a reduction in development cost.

According to another aspect of the semiconductor memory of the present invention, a cycle adjusting circuit adjusts the generation cycle in accordance with a cycle setting signal for indicating the generation cycle, the cycle setting signal being output from the second mode setting circuit. The cycle adjusting circuit can thus be configured simply.

According to another aspect of the semiconductor memory of the present invention, a width adjusting circuit of the cycle adjusting circuit adjusts the pulse width of each of the column pulses. That is, the column pulse generation cycle can be set freely by adjusting the pulse width.

According to another aspect of the semiconductor memory of the present invention, an interval adjusting circuit of the cycle adjusting circuit adjusts the pulse interval of the column pulses. That is, the column pulse generation cycle can be set freely by adjusting the pulse interval.

According to another aspect of the semiconductor memory of the present invention, a read amplifier has higher amplification power when the generation cycle is short than when the generation cycle is long. Thus, the read amplifier can amplify data on the data bus line with reliability even when the column pulse generation cycle and the cycle time are both short.

According to another aspect of the semiconductor memory of the present invention, a precharging circuit has higher drivability when the generation cycle is short than when the generation cycle is long. Thus, the precharging circuit can precharge bit lines to a predetermined voltage with reliability even when the column pulse generation cycle and the cycle time are both short.

According to another aspect of the semiconductor memory of the present invention, the second mode setting circuit sets the generation cycle in accordance with a second setting signal supplied through an external terminal. It is therefore possible to set the column pulse generation cycle in accordance with the specifications of the system in which the semiconductor memory is to be mounted on. In other words, users of the semiconductor memory can set the column pulse generation cycle freely.

According to another aspect of the semiconductor memory of the present invention, a second programming circuit outputs, to the second mode setting circuit, a second internal setting signal for initially setting the column pulse generation cycle to any one of a plurality of predetermined values in the second mode setting circuit. Consequently, the column pulse generation cycle can be surely initialized by the second programming circuit so as to prevent the semiconductor memory from malfunctioning.

According to another aspect of the semiconductor memory of the present invention, the second programming circuit has a second fuse, and outputs the second internal setting signal in accordance with the programming of the second fuse. It is therefore possible to set the column pulse generation cycle in accordance with the product specifications (operating frequency, power consumption, etc.) of the semiconductor memory to be shipped. This is particularly useful for classifying semiconductor memories fabricated using the same photomask and fabrication processes into a plurality of products for shipping in accordance with their actual power consumptions (or operating frequencies).

According to another aspect of the semiconductor memory of the present invention, the second programming circuit has a second switch made up of a conductive pattern. The conductive pattern is formed on a semiconductor substrate in conformity to the pattern configuration of a photomask to be used in a semiconductor fabrication process. The second internal setting signal is output in accordance with a voltage at a destination of the conductive pattern. It is therefore possible to set the column pulse generation cycle in accordance with the product specifications (operating frequency, power consumption, etc.) of the semiconductor memory to be shipped. This is also useful for differentiating for shipping, by switching photomasks, semiconductor memories fabricated using the same photomask and fabrication processes and having a sufficient margin in power consumption (or operating frequency) as a plurality of different products by power consumption (or operating frequencies).

According to another aspect of the semiconductor memory of the present invention, the column switches each have transistors with their gates connected to the bit lines, respectively, and either of their drains and sources connected to the data bus line. Being connected to the bit lines at their gates, the transistors have the function of amplifying the voltages of the bit lines. This system is generally referred to as direct sense system. With the column switches of direct sense system, the bit lines and the data bus line have no direct connection in read operations. This prevents the bit lines from fluctuating in voltage due to the voltage of the data bus line. That is, even when a plurality of column pulses are successively generated to turn on the column switches in succession, the time taken for restoring data in the memory cells will not be extended, thereby enabling prevention of increases in the read cycle time.

According to another aspect of the semiconductor memory of the present invention, a word line is connected to the memory cells, and is selected upon access to the memory cells. A word control circuit deselects the word line in response to the last one of the column pulses which are generated in response to the read command. The word line can thus be deselected at optimum timing independent of the number of the column pulse outputs or the column pulse generation cycle. As a result, the cycle time can be minimized.

According to another aspect of the semiconductor memory of the present invention, a reset circuit outputs a reset signal for deselecting the word line, a predetermined time after the selection of the word line. The word control circuit deselects the word line in response to either of the last column pulse and the reset signal, which arrives late. Consequently, the data restore operation can always be performed on the memory cells for a predetermined time with reliability even when the number of column pulse outputs is small. As a result, data can be surely retained in the memory cells.

According to another aspect of the semiconductor memory of the present invention, the pulse generator sets the pulse width of second and subsequent ones of the column pulses, which are generated in response to the read command, to a value smaller than the pulse width of the first column pulse. Generally, in a read operation in response to a read command, the voltages of the bit lines are amplified gradually. Thus, when a plurality of column switches are turned on in succession, the data corresponding to the column switch first to be turned on is the most difficult to read. Setting the width of the first column pulse to a sufficient value makes it possible to reliably read the first data. Moreover, shortening the pulse width of the second and subsequent column pulses can reduce the cycle time corresponding to a single read operation.

According to another aspect of the semiconductor memory of the present invention, a precharging control circuit starts precharging the bit lines in response to the last one of the column pulses generated in response to the read command. The bit lines can thus be precharged at optimum timing regardless of the number of column pulse outputs or the column pulse generation cycle. As a result, the cycle time can be minimized.

According to another aspect of the semiconductor memory of the present invention, a plurality of memory blocks each have the bit lines, the column switches, the data bus line, and the column selecting lines. A third mode setting circuit sets low power mode or high speed mode. An address conversion circuit converts the internal addresses into second internal addresses in accordance with a set value of the third mode setting circuit. The number of memory blocks to be designated during the low power mode by the second internal addresses, which are output from the address conversion circuit, is smaller than during the high speed mode. Semiconductor memories of a single type can be different products with low power consumption or with high operation speed depending on the operation mode set in the third mode setting circuit. This allows a reduction in the development cost and fabrication cost of the semiconductor memory.

According to another aspect of the semiconductor memory of the present invention, the third mode setting circuit sets the low power mode or the high speed mode in accordance with a third setting signal supplied through an external terminal. The semiconductor memory can thus be set to the low power mode or the high speed mode in accordance with the specifications of the system in which the semiconductor memory is to be mounted on. In other words, users of the semiconductor memory can set the operation mode freely.

According to another aspect of the semiconductor memory of the present invention, a third programming circuit outputs, to the third mode setting circuit, a third internal setting signal for initially setting the third mode setting circuit to the low power mode or the high speed mode. Consequently, the third programming circuit can surely initialize the operation mode of the semiconductor memory, thereby preventing the semiconductor memory from malfunctioning.

According to another aspect of the semiconductor memory of the present invention, the third programming circuit has a third fuse, and outputs the third internal setting signal in accordance with the programming of the third fuse. This allows the operation mode of the semiconductor memory to be set to the low power mode or the high speed mode in accordance with the specifications of the semiconductor memory to be shipped. This is particularly useful for classifying semiconductor memories fabricated using the same photomask and fabrication processes into a plurality of products for shipping in accordance with their actual power consumptions.

According to another aspect of the semiconductor memory of the present invention, the third programming circuit has a third switch made up of a conductive pattern which is formed on a semiconductor substrate in conformity to the pattern configuration of a photomask to be used in a semiconductor fabrication process, and outputs the third internal setting signal in accordance with a voltage at a destination of the conductive pattern. The operation mode of the semiconductor memory can thus be set to the low power mode or the high speed mode in accordance with the specifications of the semiconductor memory to be shipped. This is also useful for differentiating for shipping, by switching photomasks, semiconductor memories fabricated using the same fabrication processes and having a sufficient margin in power consumption into a plurality of different products by power consumption.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 25 is an explanatory diagram showing the operation of an address conversion circuit shown in FIG. 24;

DESCRIPTION OF THE PREFERRED EMBODIMENTS

Hereinafter, embodiments of the present invention will be described with reference to the drawings.

Figure 1:
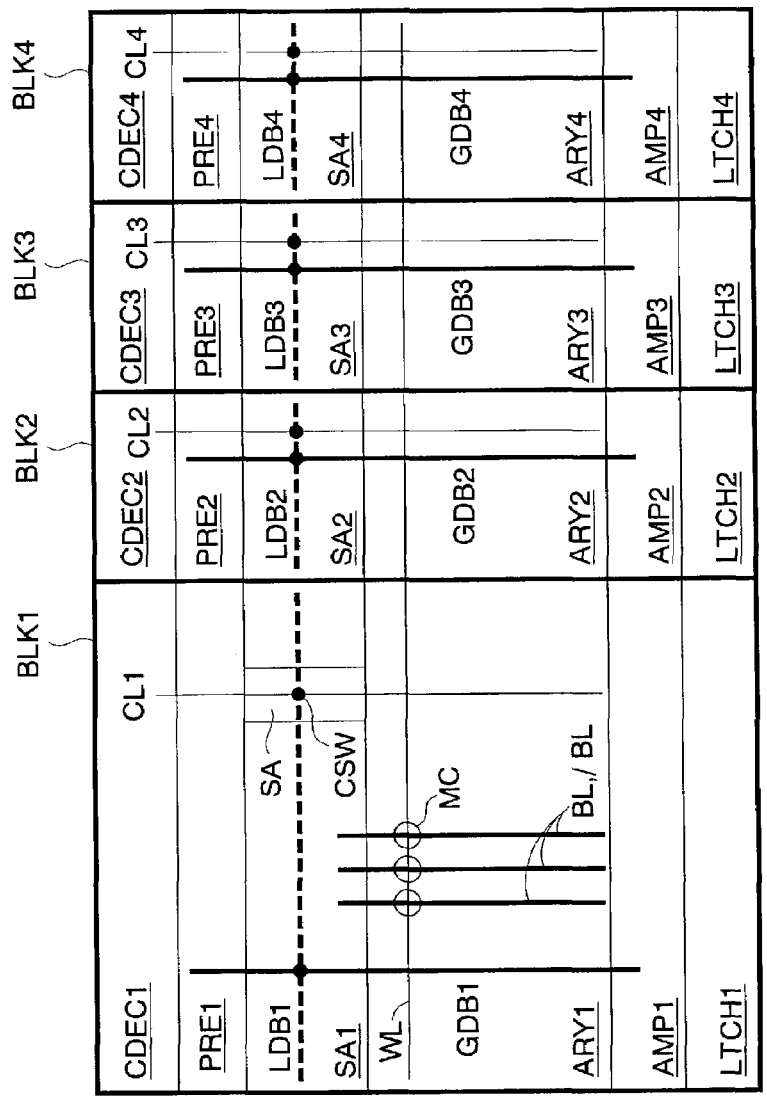
FIG. 1 is a block diagram showing an overview of a semiconductor memory having a conventional high speed page operation function.
Figure 2:
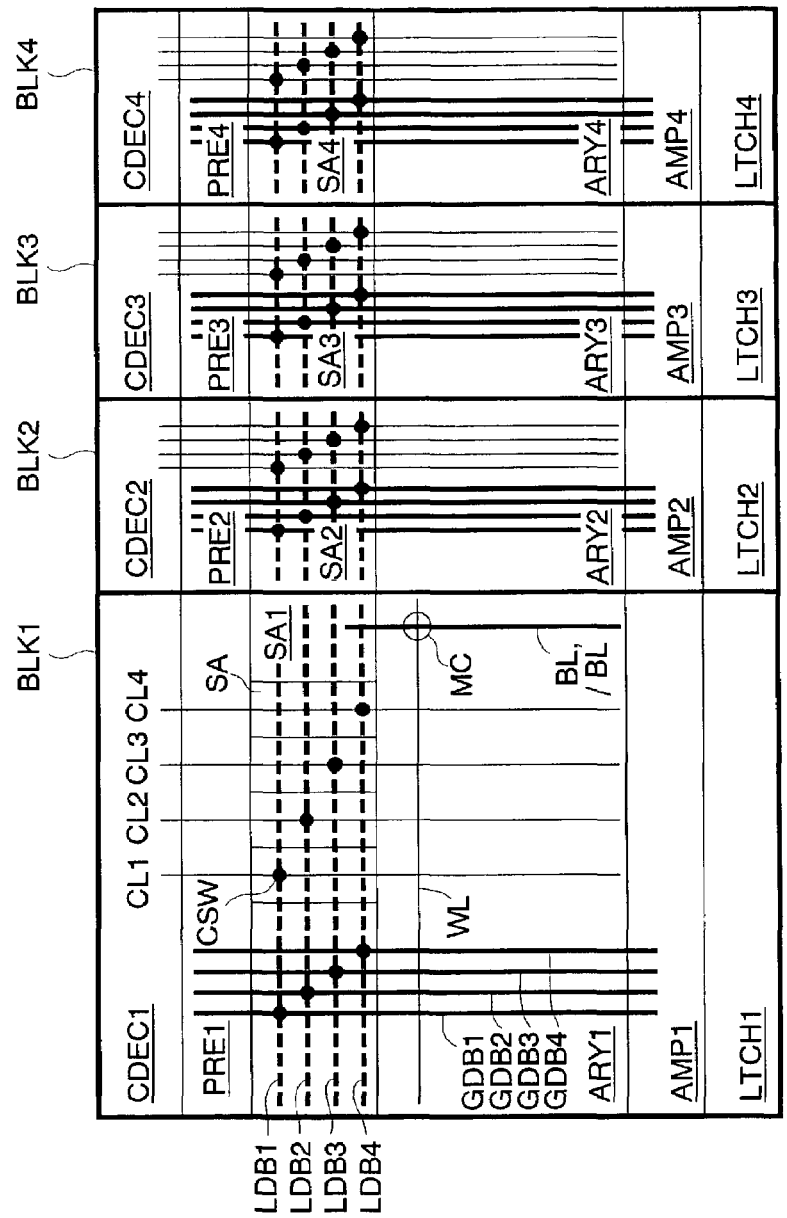
FIG. 2 is a block diagram showing an overview of another semiconductor memory having a conventional high speed page operation function.
Figure 3:
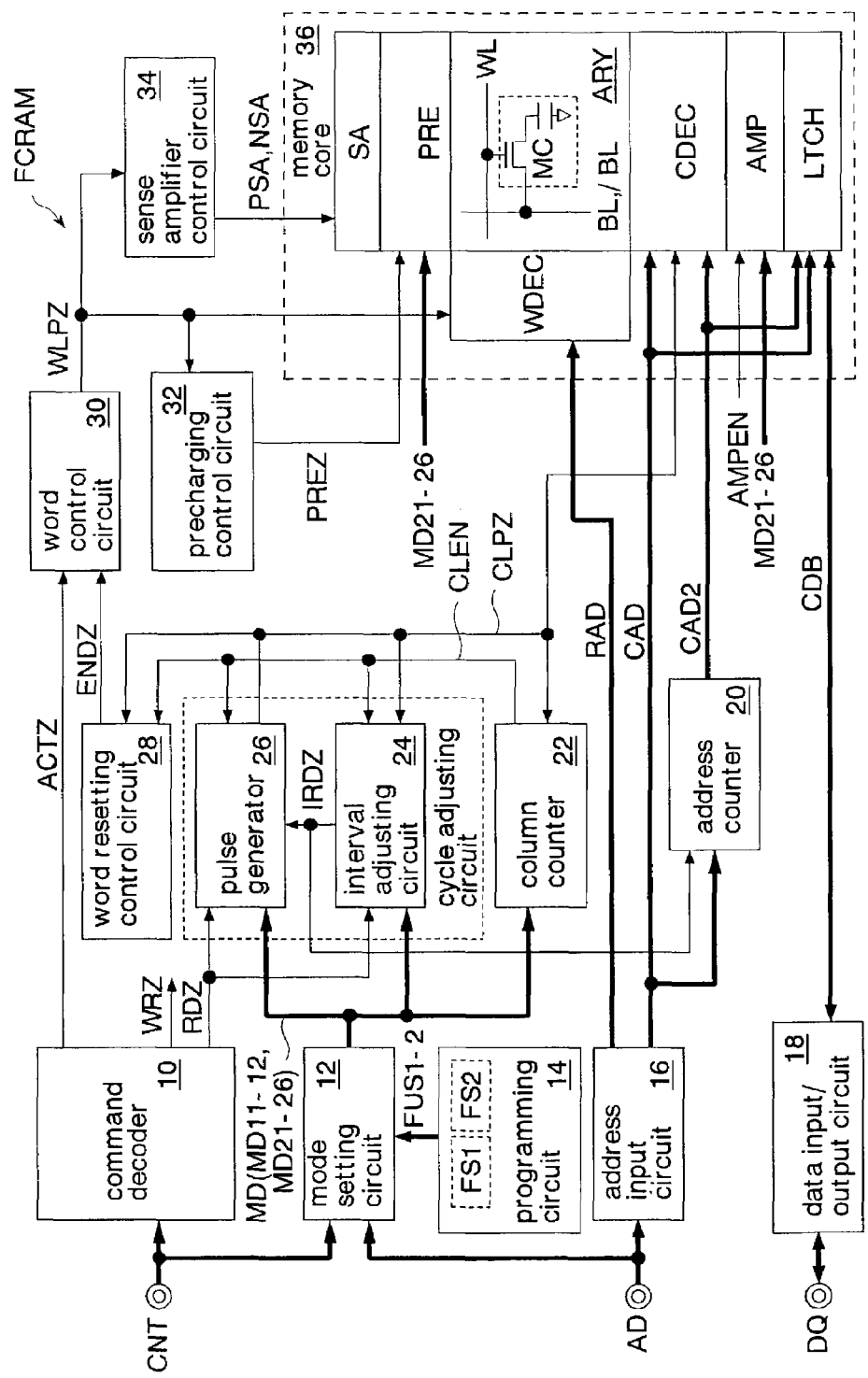
FIG. 3 is a block diagram showing a first embodiment of the present invention.

FIG. 3 shows a first embodiment of the semiconductor memory of the present invention. In the diagram, each thick line represents a signal line that consists of a plurality of bits. The double circles shown to the left in the diagram represent external terminals. Signals ending in "Z" are of positive logic. Signals with a leading "/" are of negative logic.

This semiconductor memory is formed as an FCRAM (Fast Cycle RAM) on a silicon substrate by using CMOS processes.

The FCRAM has a command decoder 10, a mode setting circuit 12, a programming circuit 14, an address input circuit 16, a data input/output circuit 18, an address counter 20, a column counter 22, an interval adjusting circuit 24, a pulse generator 26, a word reset control circuit 28, a word control circuit 30, a precharging control circuit 32, a sense amplifier control circuit 34, and a memory core 36.

The command decoder 10 decodes a control signal CNT (command signal) which is supplied to a control terminal in order to operate the FCRAM. Depending on the decoding result, the command decoder 10 outputs an active signal ACTZ, a read control signal RDZ, and so on. The active signal ACTZ is generated when a control signal for performing a read operation (read command) is supplied, when a control signal for performing a write operation (write command) is supplied, and when a control signal for performing a refresh operation (refresh command) is supplied. The read control signal RDZ is generated when a read command is supplied. A write control signal WRZ is generated when a write command is supplied.

The mode setting circuit 12 sets the operation mode of the FCRAM. The mode setting circuit 12 establishes first mode and second mode. In the first mode, the number of times a column pulse CLPZ is output from the pulse generator 26 in response to a read command or a write command is set. In the second mode, the generation cycle of the column pulses CLPZ (pulse width and pulse interval) is set. That is, the mode setting circuit 12 functions as a first mode setting circuit for setting the number of column pulses CLPZ and a second mode setting circuit for setting the generation cycle of the column pulses CLPZ.

The number of column pulses CLPZ to be generated is set in accordance with the value of an address signal AD (first setting signal) that is supplied through an address terminal along with a control signal CNT indicating a mode setting command after the FCRAM is powered on. Similarly, the pulse width and pulse interval of the column pulses CLPZ are set in accordance with the value of the address signal AD (second setting signal) which is supplied through the address terminal along with the control signal CNT indicating the mode setting command after the FCRAM is powered on. Besides, the first mode and the second mode are initialized in accordance with the logical levels of fuse signals FUS1–2 which are output from the programming circuit 14 when the FCRAM is powered on.

The mode setting circuit 12 outputs mode signals MD (MD11–12, MD21–26) corresponding to the operation mode established. Specifically, the mode setting circuit 12 changes either one of the first mode signals MD11–12 to high level in accordance with the first mode established, and changes any one of the second mode signals MD21–23 and any one of the second mode signals MD24–26 to high level in accordance with the second mode established. The number of times the column pulse CLPZ is output is adjusted by the first mode signals MD11–12. The pulse interval and pulse width of the column pulses CLPZ are adjusted by the second mode signals MD21–23 and MD24–26, respectively.

The programming circuit 14, as mentioned above, outputs the fuse signals FUS1–2 for determining the initial state of the mode setting circuit 12 to the mode setting circuit 12. The programming circuit 14 has a first fuse FS1 for indicating the initial value of the number of column pulses CLPZ, and a plurality of second fuses FS2 for indicating the generation cycle of the column pulses CLPZ. Then, the programming circuit 14 outputs the fuse signal FUS1 (first internal setting signal) in accordance with the programming of the first fuse FS1, and outputs the fuse signal FUS2 (second internal setting signal) in accordance with the programming of the second fuses FS2.

That is, the programming circuit 14 functions as a first programming circuit for outputting the fuse signal (first internal setting signal) FUS1 for indicating the initial value of the number of column pulses CLPZ, and a second programming circuit for outputting the fuse signal (second internal setting signal) FUS2 for indicating the initial value of the generation cycle (pulse width and pulse interval) of the column pulses CLPZ.

The address input circuit 16 receives the address signal AD through the address terminal, and outputs the received signal AD as a row address signal RAD and a column address signal CAD. In this FCRAM, the row address signal RAD and the column address signal CAD are supplied to the address terminal simultaneously (address non-multiplexing).

The data input/output circuit 18 converts read data that is read from the memory core 32 in a read operation and transmitted to a common data bus line CDB (parallel data on CDB) into serial data, and outputs the same to the data terminal DQ in succession. The data input/output circuit 20 also converts serial write data successively supplied through the data terminal DQ in a write operation into parallel data, and outputs the same to the memory core 32 through the common data bus line CDB. The data terminal DQ consists of eight bits (DQ0–7). It should be noted that the following description will deal with the circuits and operations corresponding to a single bit of data signal DQ. The actual circuitry is formed for eight bits of data signal DQ.

The address counter 20 outputs lower bits of the column address signal CAD (lower column address signal CAD) as an internal column address signal CAD2. Moreover, the address counter 20 increments the lower column address signal CAD by one in synchronization with internal read control signals IRDZ, and outputs the incremented signals as internal column address signals CAD2 in succession. For example, the lower column address signal CAD consists of two bits.

When a lower column address signal CAD of "00" in binary is supplied in association with a read command, internal column address signals CAD2 of "00", "01", "10", and "11" are output in succession. When a lower column address signal CAD of "10" in binary is supplied in association with a read command, internal column address signals CAD2 of "10", "11", "00", and "01" are output in succession. That is, the address counter 20 has the function of a binary counter.

The column counter 22 receives the column pulse CLPZ and the mode signals MD (first mode signals MD11–12), and outputs a column enable signal CLEN until column pulses CLPZ as many as the number indicated by the mode signals MD are output. That is, the column counter 22 functions as a number control circuit for controlling the number of column pulses CLPZ which the pulse generator 26 output.

The interval adjusting circuit 24 operates during an activation period (high level period) of the column enable signal CLEN, outputting internal read control signals IRDZ in synchronization with the falling edges of the column pulses CLPZ. The interval between the falling edge of a column pulse CLPZ and the rising edge of an internal read control signal IRDZ (=the pulse interval of the column pulses CLPZ) is adjusted in accordance with the mode signals MD (second mode signals MD21–23).

The pulse generator 26 operates during the activation period of the column enable signal CLEN, generating column pulses CLPZ in synchronization with the read control signal RDZ and the internal read control signals IRDZ. The pulse width of the column pulses CLPZ is adjusted in accordance with the mode signals MD (second mode signals MD24–26). That is, the pulse generator 26 functions as a width adjusting circuit for adjusting the pulse width of the column pulses CLPZ.

The pulse interval and pulse width of the column pulses CLPZ can be adjusted to adjust the generation cycle of the column pulses CLPZ. That is, the interval adjusting circuit 24 and the pulse generator 26 constitute a cycle adjusting circuit for adjusting the generation cycle of the column pulses CLPZ.

The word reset control circuit 28 outputs an end signal ENDZ (pulsed signal) in synchronization with the last column pulse CLPZ out of the column pulses CLPZ generated in response to a read command or a write command.

The word control circuit 30 sets a word pulse WLPZ in response to the active signal ACTZ, and resets the word pulse WLPZ in response to the end signal ENDZ. The word pulse WLPZ is a timing signal for determining the selecting period of word lines WL to be described later. Word lines WL are activated (selected) in synchronization with a high level period of the word pulse WLPZ. That is, the word control circuit 30 deselects the selected word line WL in response to the last column pulse CLPZ out of the column pulses CLPZ generated in response to a read command or a write command.

The precharging control circuit 32 changes a precharging signal PREZ to high level in synchronization with the falling edge of the word pulse WLPZ. The precharging signal PREZ's going to high level precharges bit lines BL and /BL to a precharging voltage.

The sense amplifier control circuit 34 activates sense amplifier activating signals PSA and NSA in synchronization with the activation of the word pulse WLPZ.

The memory core 36 has a word decoder unit WDEC, a sense amplifier unit SA, a precharging unit PRE, a memory cell array ARY, a column decoder unit CDEC, an amplifier unit AMP, and a latch unit LTCH.

The word decoder unit WDEC has a plurality of word decoders which operate in accordance with the row address signal RAD. In accessing memory cells MC, a word decoder activated by the row address signal RAD selects a word line WL in synchronization with the word pulse WLPZ.

The sense amplifier unit SA has a plurality of sense amplifiers which operate in accordance with the sense amplifier activating signals PSA and NSA to amplify voltage differences between the bit lines BL and /BL. The sense amplifier unit SA also has a plurality of column switches CSW (described in FIG. 9 to be seen later) which operate in accordance with column selecting lines selected by the column address signals CAD and CAD2. The column switches CSW turn on in synchronization with the column pulses CLPZ.

The precharging unit PRE has a plurality of precharging circuits which operate in accordance with the precharging signal PREZ. The drivability of each precharging circuit is adjusted in accordance with the second mode signals MD21–26, and it has high drivability when the generation cycle of the column pulses CLPZ is short, and has low drivability when the generation cycle is long.

The memory cell array ARY has a plurality of volatile memory cells MC arranged in a matrix, as well as a plurality of word lines WL and a plurality of bit lines BL, /BL connected to the memory cells MC. The memory cells MC are the same as typical DRAM memory cells (dynamic memory cells), each having a capacitor for retaining data in the form of a charge and a transfer transistor arranged between this capacitor and a bit line BL (or /BL). The gate of the transfer transistor is connected to a word line WL. Each bit line pair BL, /BL is connected to a sense amplifier and a precharging circuit.

The column decoder unit CDEC has a plurality of column decoders which operate in accordance with the column address signals CAD and CAD2. In accessing the memory cells MC, the column decoders successively select column selecting lines CL (described in FIG. 8 to be seen later) corresponding to the respective column address signals CAD and CAD2 (internal addresses) in synchronization with the column pulses CLPZ.

The amplifier unit AMP has a plurality of read amplifiers and a plurality of write amplifiers. The read amplifiers amplify respective pieces of serial read data output from the memory cell array ARY in a read operation, in synchronization with an amplifier enable signal AMPEN. The amplifier enable signal AMPEN is generated in synchronization with the column pulses CLPZ. The amplification power of each read amplifier is adjusted in accordance with the second mode signals MD21–26. The read amplifier has high amplification power when the generation cycle of the column pulses CLPZ is short and it has low amplification power when the generation cycle is long. The write amplifies amplify respective pieces of write data successively supplied from the data terminal DQ in a write operation.

The latch unit LTCH is connected to the common data bus line CDB. The latch unit LTCH latches the serial read data output from the read amplifiers of the amplifier unit AMP in accordance with the column address signals CAD2, respectively. The latched data is output to the common data bus line CDB as parallel data in accordance with the column address signal CAD.

Figure 4:
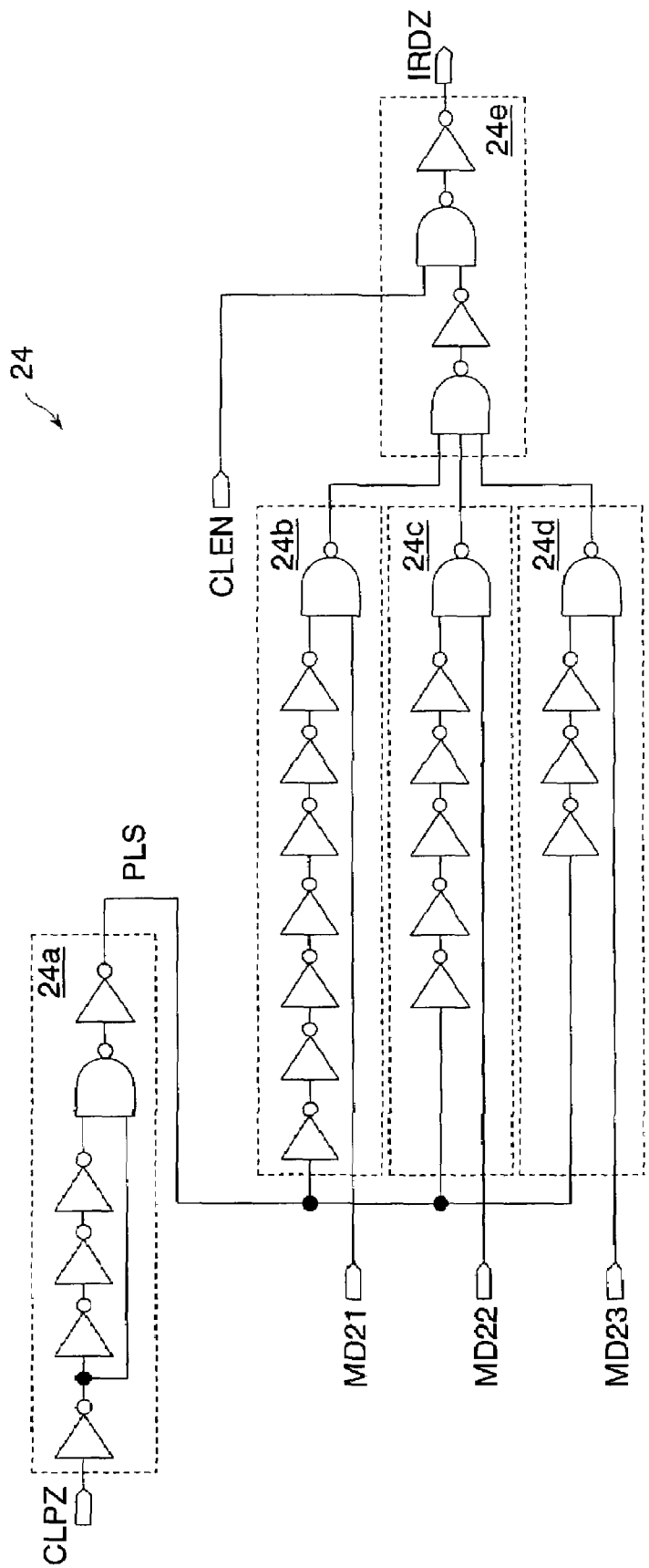
FIG. 4 is a circuit diagram showing the details of an interval adjusting circuit shown in FIG. 3.

FIG. 4 shows the details of the interval adjusting circuit 24 shown in FIG. 3.

The interval adjusting circuit 24 has logic circuits 24a, 24b, 24c, 24d, and 24e. The logic circuit 24a generates a pulse PLS in synchronization with the falling edge of the column pulse CLPZ. The logic circuit 24b is activated when the second mode signal MD21 is at high level, outputting a signal which delays from the column pulse CLPZ by a time T1. The logic circuit 24c is activated when the mode signal MD22 is at high level, outputting a signal which delays from the column pulse CLPZ by a time T2. The logic circuit 24d is activated when the mode signal MD23 is at high level, outputting a signal which delays from the column pulse CLPZ by a time T3. The times T1, T2, and T3 are set in accordance with the numbers of inverters in the logic circuits 24b, 24c, and 24d, respectively.

The logic circuit 24e has an OR circuit of negative logic which performs an OR operation on the outputs of the logic circuits 24b–24d, and an AND circuit which is activated when the column enable signal CLEN is at high level, outputting the output of the OR circuit as the internal read control signal IRDZ.

Figure 5:
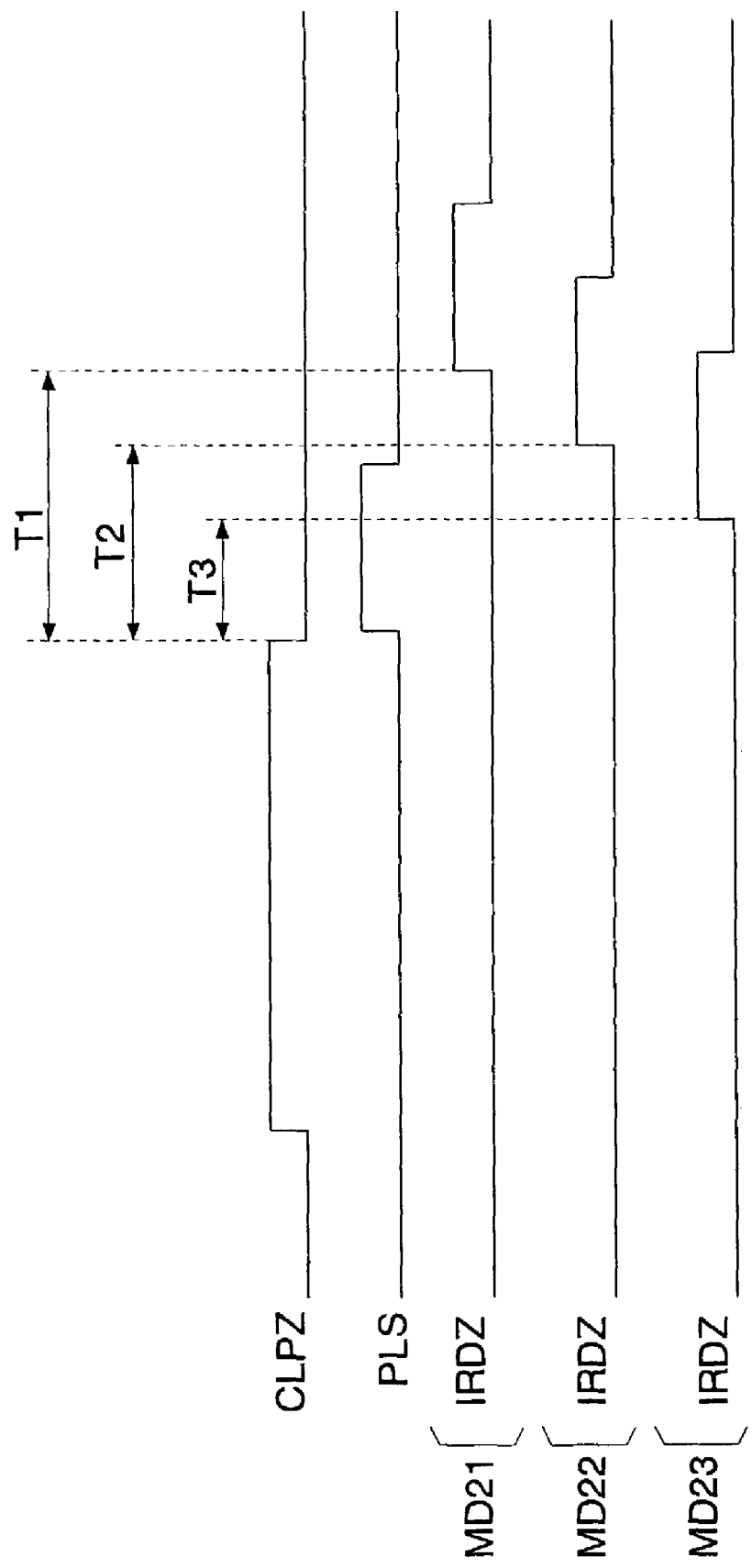
FIG. 5 is a timing chart showing the operation of the interval adjusting circuit shown in FIG. 4.

FIG. 5 shows the operation of the interval adjusting circuit 24 shown in FIG. 4.

When the mode setting circuit 12 shown in FIG. 3 outputs the second mode signal MD21 of high level and the second mode signals MD22 and MD23 of low level, the interval between the column pulse CLPZ and the internal read control signal IRDZ is the time T1. Similarly, with the second mode signal MD22 of high level and the second mode signals MD21 and MD23 of low level, the interval between the column pulse CLPZ and the internal read control signal IRDZ is the time T2 which is shorter than the time T1. With the second mode signal MD23 of high level and the second mode signals MD21 and MD22 of low level, the interval between the column pulse CLPZ and the internal read control signal IRDZ is the time T3 which is shorter than the time T2.

The pulse generator 26 generates column pulses CLPZ in synchronization with internal read control signals IRDZ. Consequently, the pulse interval of the column pulses CLPZ is adjusted by the second mode signals MD21–23.

Figure 6:
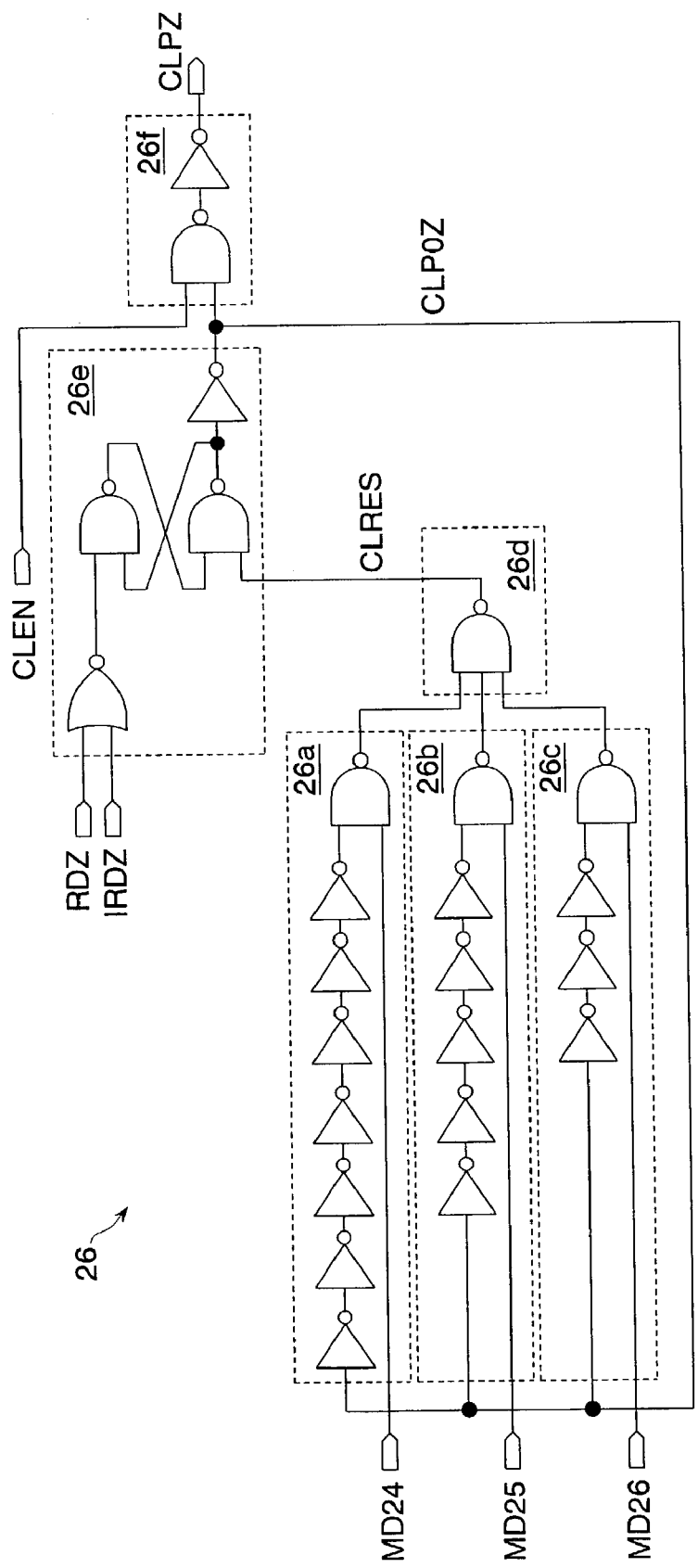
FIG. 6 is a circuit diagram showing the details of a pulse generator shown in FIG. 3.

FIG. 6 shows the details of the pulse generator 26 shown in FIG. 3.

The pulse generator 26 has logic circuits 26a, 26b, 26c, 26d, 26e, and 26f. The logic circuit 26a is activated when the second mode signal MD24 is at high level, outputting a signal which delays from a column pulse CLP0Z by a time T4. The logic circuit 26b is activated when the second mode signal MD25 is at high level, outputting a signal which delays from the column pulse CLP0Z by a time T5. The logic circuit 26c is activated when the second mode signal MD26 is at high level, outputting a signal which delays from the column pulse CLP0Z by a time T6. The times T4, T5, and T6 are set in accordance with the numbers of inverters in the logic circuits 26a, 26b, and 26c.

The logic circuit 26d changes a column reset signal CLRES from high level to low level when the outputs of the logic circuits 26a, 26b, and 26c vary from low level to high level. The logic circuit 26e has an RS flip-flop. The RS flip-flop is set in synchronization with the rising edge of the read control signal RDZ or the internal read control signal IRDZ to change the column pulse CLP0Z to high level, and is reset in synchronization with the falling edge of the column reset signal CLRES to change the column pulse CLP0Z to low level. The logic circuit 26f is activated when the column enable signal CLEN is at high level, outputting the column pulse CLP0Z as the column pulse CLPZ.

Figure 7:
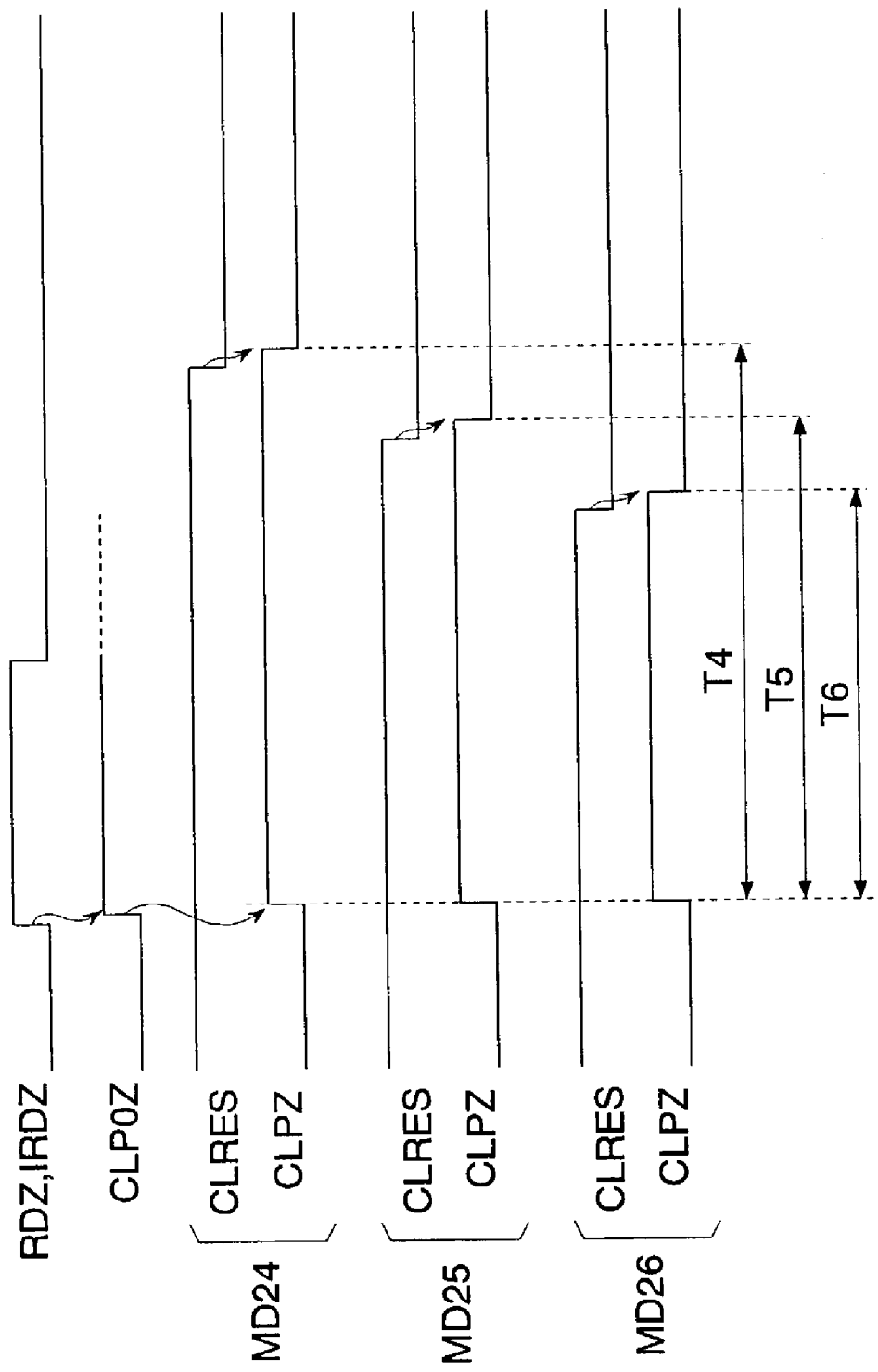
FIG. 7 is a timing chart showing the operation of the pulse generator shown in FIG. 6.

FIG. 7 shows the operation of the pulse generator 26 shown in FIG. 6.

When the mode setting circuit 12 shown in FIG. 3 outputs the mode signal MD24 of high level and the mode signals MD25 and MD26 of low level, the pulse width of the column pulse CLPZ is the time T4. Similarly, with the mode signal MD25 of high level and the mode signals MD24 and MD26 of low level, the pulse width of the column pulse CLPZ is the time T5 which is shorter than the time T4. With the mode signal MD26 of high level and the mode signals MD24 and MD25 of low level, the pulse width of the column pulse CLPZ is the time T6 which is shorter than the time T5. That is, the pulse width of the column pulse CLPZ is adjusted by the mode signals MD24–26.

Figure 8:
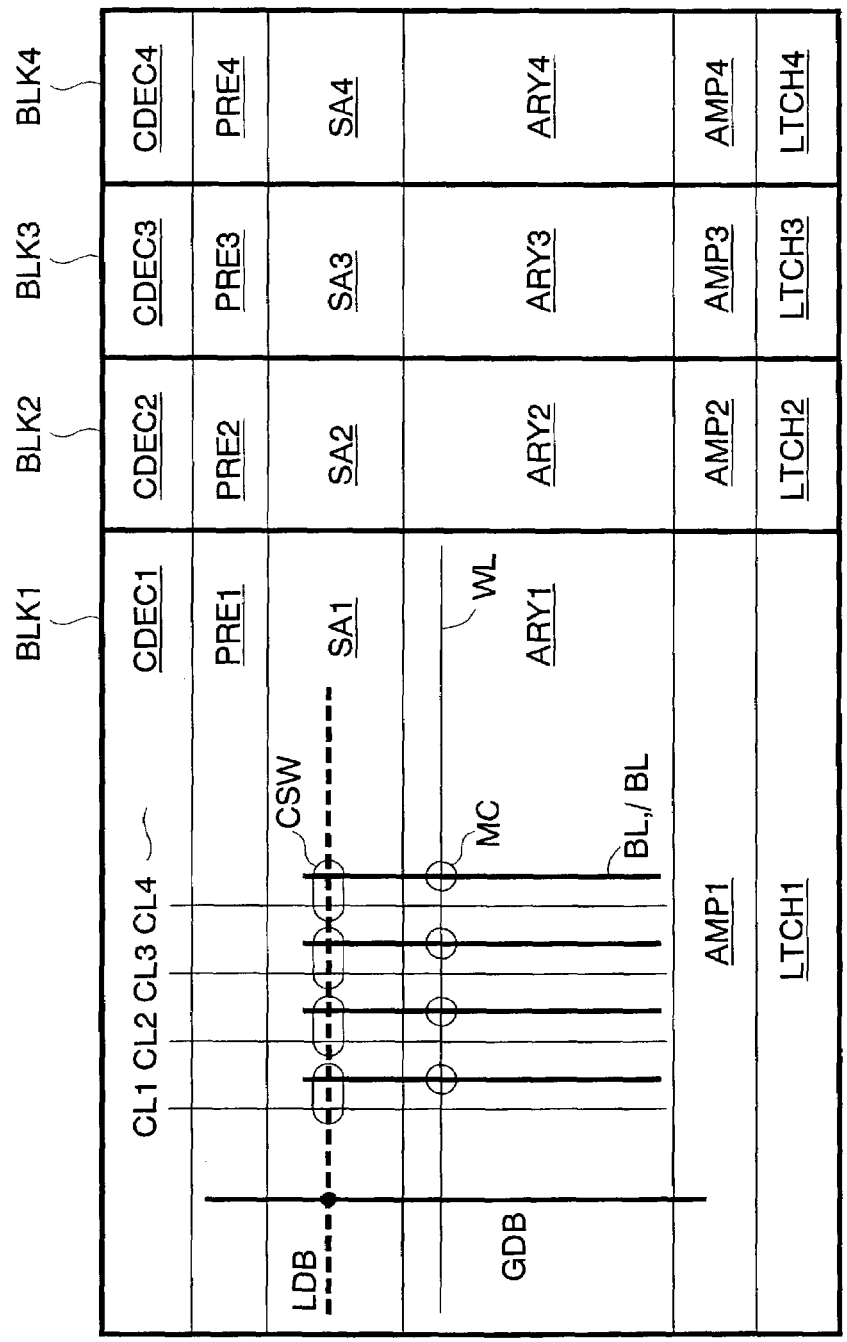
FIG. 8 is a block diagram showing an overview of essential parts of a memory core shown in FIG. 3.

FIG. 8 shows an overview of essential parts of the memory core 36 shown in FIG. 3.

The memory core 36 has four memory blocks BLK (BLK1–BLK4). The memory block BLK1 has a column decoder unit CDEC1, a precharging unit PRE1, a sense amplifier unit SA1, a memory cell array ARY1, an amplifier unit AMP1, and a latch unit LTCH1. Similarly, the memory blocks BLK2–BLK4 have column decoder units CDEC2–CDEC4, precharging units PRE2–PRE4, sense amplifier units SA2–SA4, memory cell arrays ARY2–ARY4, amplifier units AMP2–AMP4, and latch units LTCH2–LTCH4, respectively. In other words, the column decoder unit CDEC, the precharging unit PRE, the sense amplifier unit SA, the memory cell array ARY, the amplifier unit AMP, and the latch unit LTCH shown in FIG. 3 consist of four blocks each.

The memory blocks BLK1–BLK4 are identified by the upper two bits of the row address signal RAD. The memory blocks BLK1–BLK4 have the same structure.

The memory blocks BLK1–BLK4 each have a plurality of column switches CSW connected to bit line pairs BL, /BL, respectively, column selecting lines CL1, CL2, CL3, CL4, . . . for controlling the column switches CSW, a local data bus line LDB to be connected to the bit line pairs BL, /BL through the column switches CSW, and a global data bus line GDB connected to the local data bus line LDB.

Figure 9:
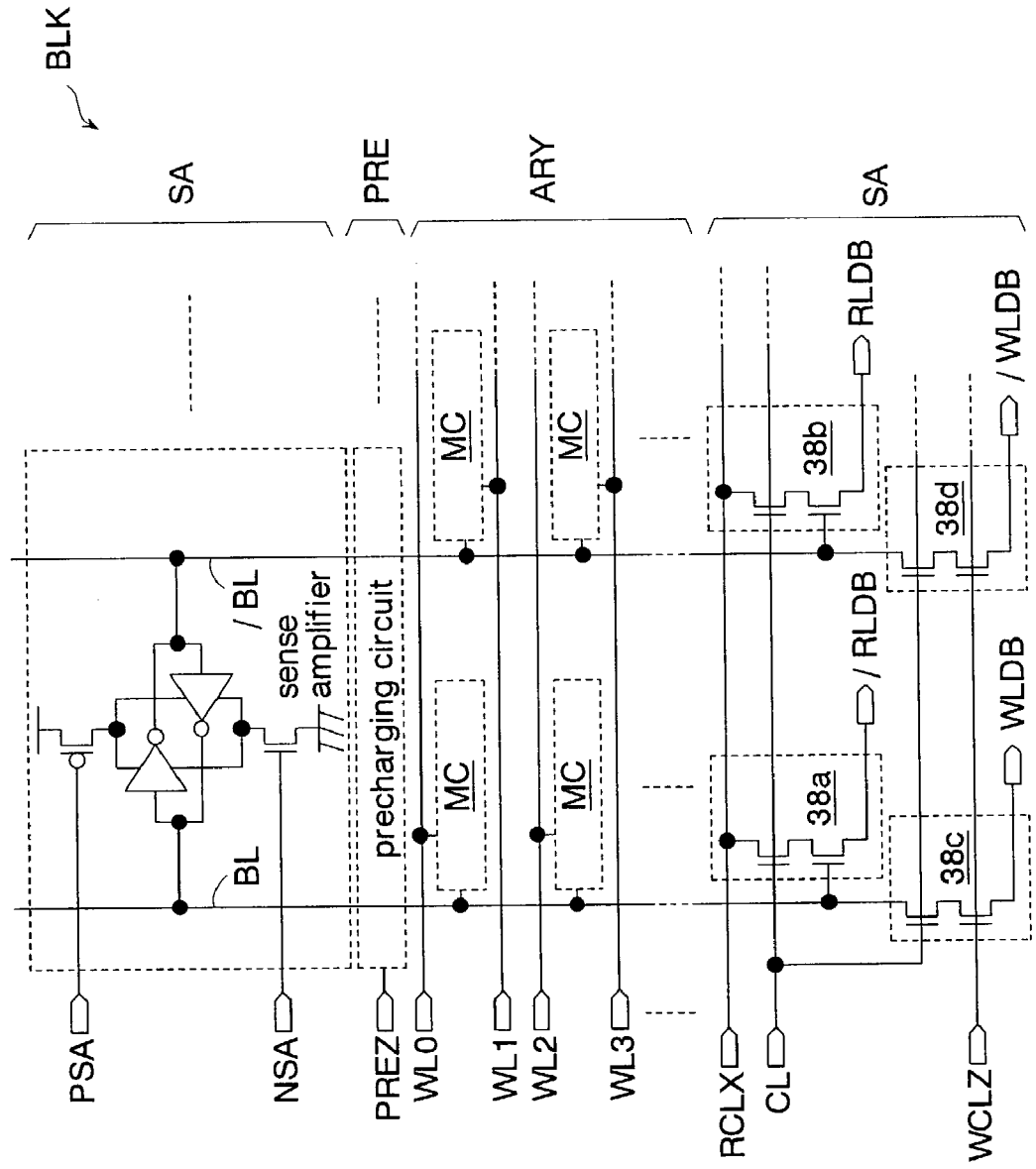
FIG. 9 is a circuit diagram showing the details of essential parts of a memory block shown in FIG. 8.

FIG. 9 shows the details of essential parts of the memory blocks BLK shown in FIG. 8.

A memory block BLK has sense amplifiers and precharging circuits which are formed for the respective complementary bit line pairs BL, /BL. An identical word line WL (for example, WL0) is connected with either ones of the memory cells MC connected to the bit lines BL and /BL.

A sense amplifier has a latch consisting of two CMOS inverters having their inputs and outputs connected to each other, a pMOS transistor for connecting the sources of the pMOS transistors of the CMOS inverters to a power supply line in accordance with the sense amplifier activating signal PSA, and an nMOS transistor for connecting the sources of the nMOS transistors of the CMOS inverters to a ground line in accordance with the sense amplifier activating signal NSA.

Each column switch CSW has switches 38a, 38b, 38c, and 38d consisting of two nMOS transistors connected in series.

The switch 38a connects the bit line BL to a read local data bus line /RLDB. The switch 38b connects the bit line /BL to a read local data bus line RLDB. The switch 38c connects the bit line BL to a write local data bus line WLDB. The switch 38d connects the bit line /BL to a write local data bus line /WLDB.

One of the nMOS transistors of the switch 38a is connected to the signal line of a read control signal RCLX at its source and to a column selecting line CL (any one of CL1, CL2, CL3, CL4, . . . ) at its gate. The other nMOS transistor of the switch 38a is connected to the bit line BL at its gate and to the read local data bus line /RLDB at its drain. Similarly, one of the nMOS transistors of the switch 38b is connected to the signal line of the read control signal RCLX at its source and to the column selecting line CL (any one of CL1, CL2, CL3, CL4, . . . ) at its gate. The other nMOS transistor of the switch 38b is connected to the bit line /BL at its gate and to the read local data bus line RLDB at its drain. The read control signal RCLX is activated in a read operation in accordance with the row address signal RAD or the column address signal CAD.

The system in which the bit lines BL (or /BL) are connected to the gates of the transistors is referred to as direct sense system. Column switches CSW of direct sense system have the function of amplifying the voltages of the bit lines BL (or /BL). Since column switches CSW of direct sense system establish no direct connection between bit lines and data bus lines during a read operation, the bit lines BL and /BL are prevented from fluctuating in voltage due to voltage variations of the read local data bus lines RLDB and /RLDB. That is, even when a plurality of column pulses CLPZ are successively generated to turn on the column switches CSW in succession, the read cycle time can be prevented from increasing since the time taken for restoring data to the memory cells MC will not get longer.

One of the nMOS transistors of the switch 38c is connected to the bit line BL at its source and to the column selecting line CL (any one of CL1, CL2, CL3, CL4, . . . ) at its gate. The other nMOS transistor of the switch 38c is connected to a write control signal WCLZ at its gate and to the write local data bus line WLDB at its drain. Similarly, one of the nMOS transistors of the switch 38d is connected to the bit line /BL at its source and to the column selecting line CL (any one of CL1, CL2, CL3, CL4, . . . ) at its gate. The other nMOS transistor of the switch 38d is connected to the write control signal WCLZ at its gate and to the write local data bus line /WLDB at its drain. The write control signal WCLZ is activated in a write operation in accordance with the column address signal CAD.

Figure 10:
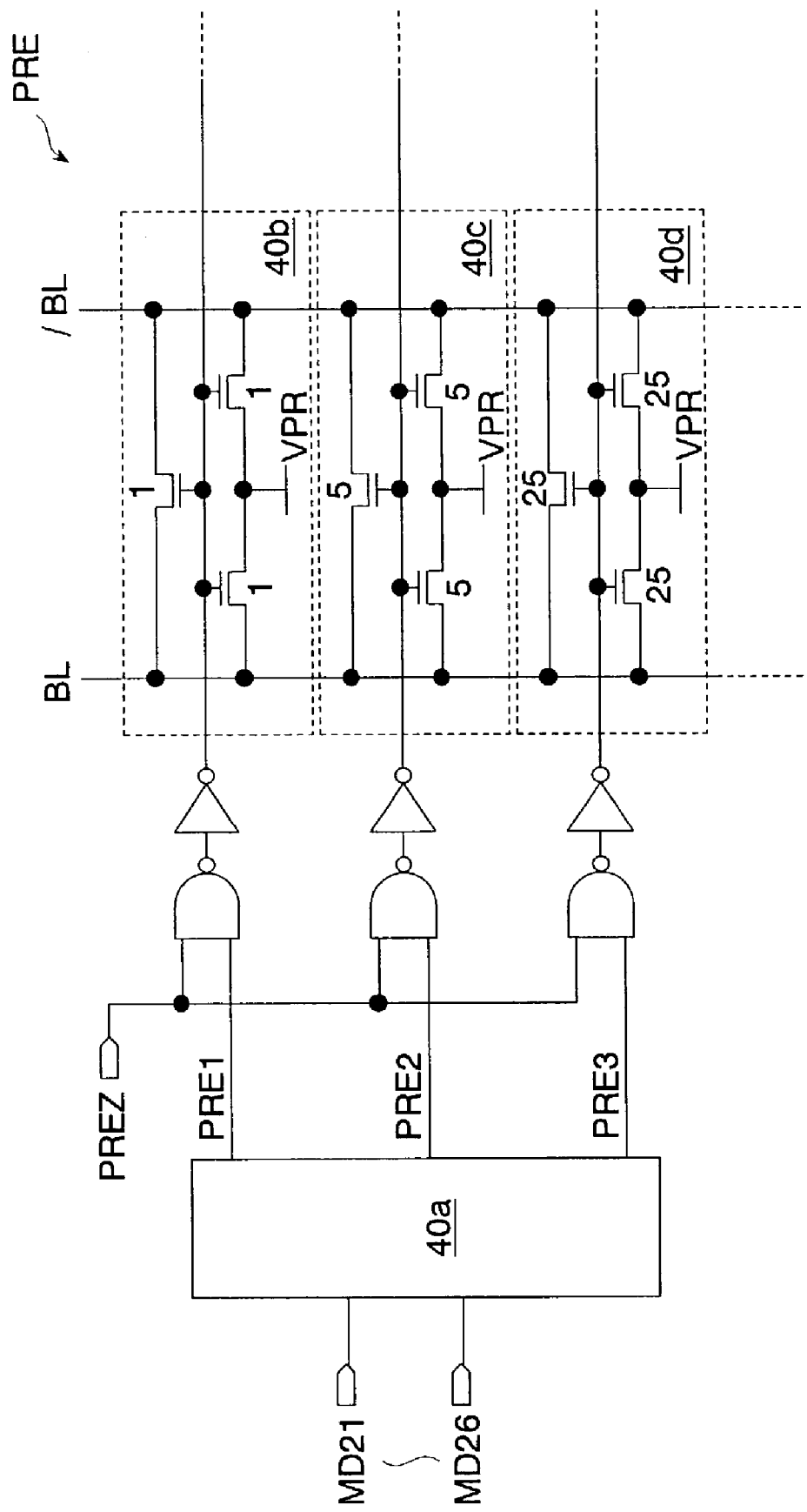
FIG. 10 is a circuit diagram showing the details of a precharging circuit shown in FIG. 9.

FIG. 10 shows the details of the precharging circuit shown in FIG. 9.

The precharging circuit has a decoding circuit 40a, a first precharging circuit 40b, a second precharging circuit 40c, and a third precharging circuit 40d. The decoding circuit 40a receives the second mode signals MD21–26, and changes any one of first to third precharging signals PRE1–PRE3 to high level. The decoding circuit 40a turns the first precharging signal PRE1 to high level, upon determining from the logical levels of the second mode signals MD21–26 that the generation cycle of the column pulses CLPZ is long. The decoding circuit 40a changes the second precharging signal PRE2 to high level, upon determining from the logical levels of the second mode signals MD21–26 that the generation cycle of the column pulses CLPZ is normal. The decoding circuit 40a changes the third precharging signal PRE3 to high level, upon determining from the logical levels of the second mode signals MD21–26 that the generation cycle of the column pulses CLPZ is short.

The first to third precharging circuits 40b, 40c, and 40d each have nMOS transistors for connecting the bit lines BL and /BL to a precharging voltage line VPR, respectively, and an nMOS transistor for equalizing the bit lines BL and /BL. The nMOS transistors of the first to third precharging circuits 40b, 40c, and 40d have their gate widths in the ratio of 1:5:25. The figures given to the nMOS transistors represent the ratio of the gate widths. The nMOS transistors of the first to third precharging circuits 40b, 40c, and 40d have the same channel length.

The first precharging circuit 40b connects the bit lines BL and /BL to the precharging voltage line VPR in synchronization with the precharging signal PREZ when the first precharging signal PRE1 is at high level. The second precharging circuit 40c connects the bit lines BL and /BL to the precharging voltage line VPR in synchronization with the precharging signal PREZ when the second precharging signal PRE2 is at high level. The third precharging circuit 40d connects the bit lines BL and /BL to the precharging voltage line VPR in synchronization with the precharging signal PREZ when the third precharging signal PRE3 is at high level. That is, the shorter the generation cycle of the column pulses CLPZ is, the faster the precharge operation is performed.

Figure 11:
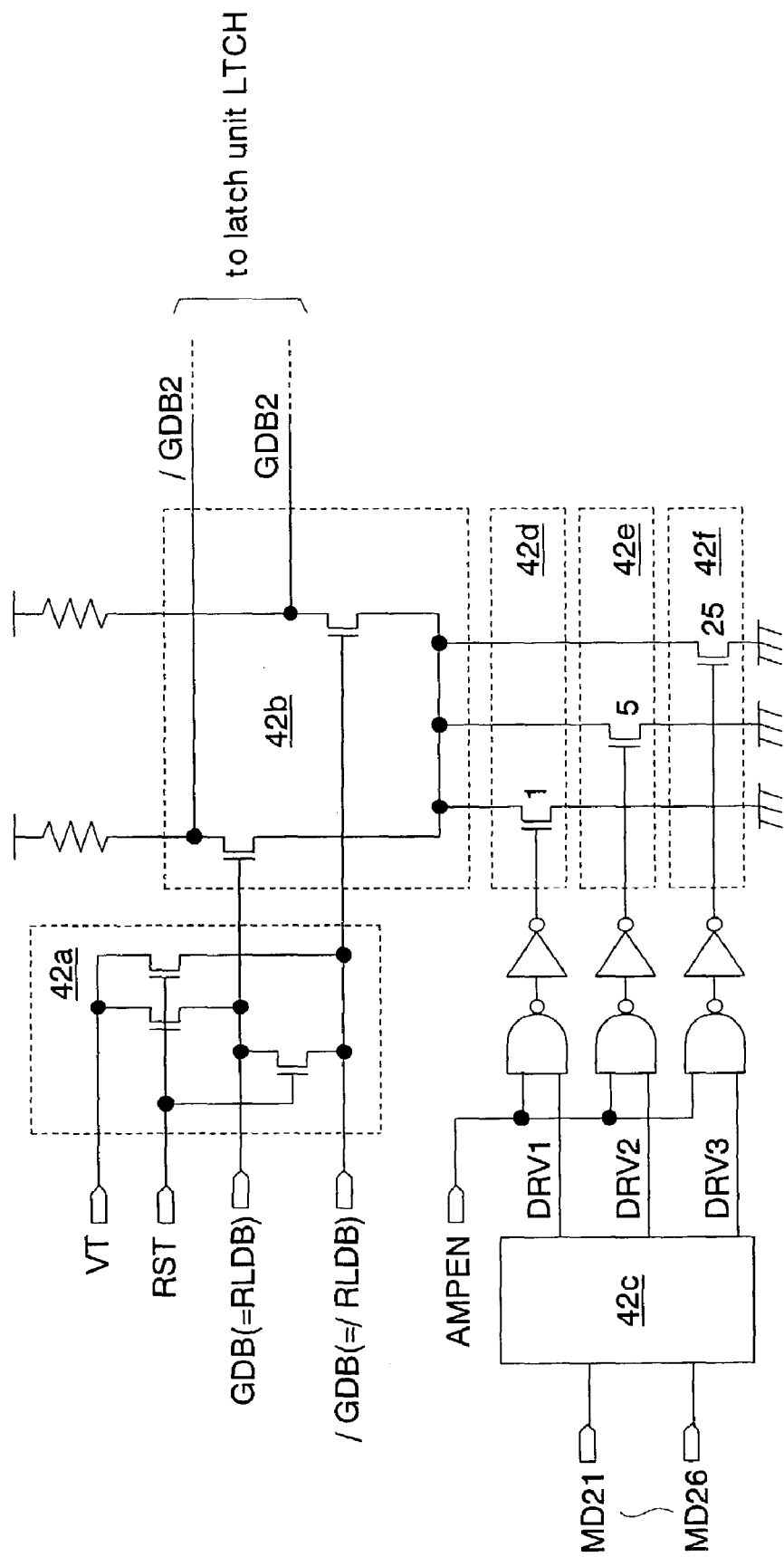
FIG. 11 is a circuit diagram showing the details of an amplifier unit shown in FIG. 8.

FIG. 11 shows the details of the read amplifiers in the amplifier unit AMP shown in FIG. 8.

A read amplifier has a reset circuit 42a, an amplifier circuit 42b, a decoding circuit 42c, and first to third source circuits 42d, 42e, and 42f. The reset circuit 42a has nMOS transistors for connecting global bit lines GDB and /GDB to a reset voltage line VT when a reset signal RST is at high level, and an nMOS transistor for equalizing the global bit lines GDB and /GDB when the reset signal RST is at high level. The amplifier circuit 42b has a pair of nMOS transistors whose gates are connected to the global bit lines GDB and /GDB, respectively, whose drains are connected to the power supply line through load resistors, respectively, and whose sources are connected to the source circuits 42d, 42e, and 42f. The outputs (drains) of the nMOS transistors are connected to the latch unit LTCH.

The decoding circuit 42c receives the second mode signals MD21–26, and changes any one of first to third driving signals DRV1–DRV3 to high level. The decoding circuit 42c changes the first driving signal DRV1 to high level, upon determining from the logical levels of the second mode signals MD21–26 that the generation cycle of the column pulses CLPZ is long. The decoding circuit 42c changes the second driving signal DRV2 to high level, upon determining from the logical levels of the second mode signals MD21–26 that the generation cycle of the column pulses CLPZ is normal. The decoding circuit 42c changes the third driving signal DRV3 to high level, upon determining from the logical levels of the second mode signals MD21–26 that the generation cycle of the column pulses CLPZ is short.

The first to third source circuits 42d, 42e, and 42f each have an nMOS transistor for connecting the sources of the nMOS transistors of the amplifier circuit 42b to the ground line. The nMOS transistors of the first to third source circuits 42d, 42e, and 42f have their gate widths in the ratio of 1:5:25. The figures given to the nMOS transistors represent the ratio of the gate widths. The nMOS transistors of the first to third source circuits 42d, 42e, and 42f have the same channel length.

The first source circuit 42d connects the amplifier circuit 42b to the ground line in synchronization with the amplifier enable signal AMPEN when the first driving signal DRV1 is at high level. The second source circuit 42e connects the amplifier circuit 42b to the ground line in synchronization with the amplifier enable signal AMPEN when the second driving signal DRV2 is at high level. The third source circuit 42f connects the amplifier circuit 42b to the ground line in synchronization with the amplifier enable signal AMPEN when the third driving signal DRV3 is at high level. That is, the shorter the generation cycle of the column pulses CLPZ is, the faster the amplifying operation of the amplifier circuit 42b is performed.

Note that, although not shown in the drawing, the write amplifiers, like the read amplifiers, have decoding circuits for outputting predetermined driving signals in accordance with the second mode signals MD21–26 and amplifier circuits with its amplification power varying in accordance with the driving signals. That is, the shorter the generation cycle of the column pulses CLPZ is, the faster the amplifying operations of the write amplifiers are performed.

Figure 12:
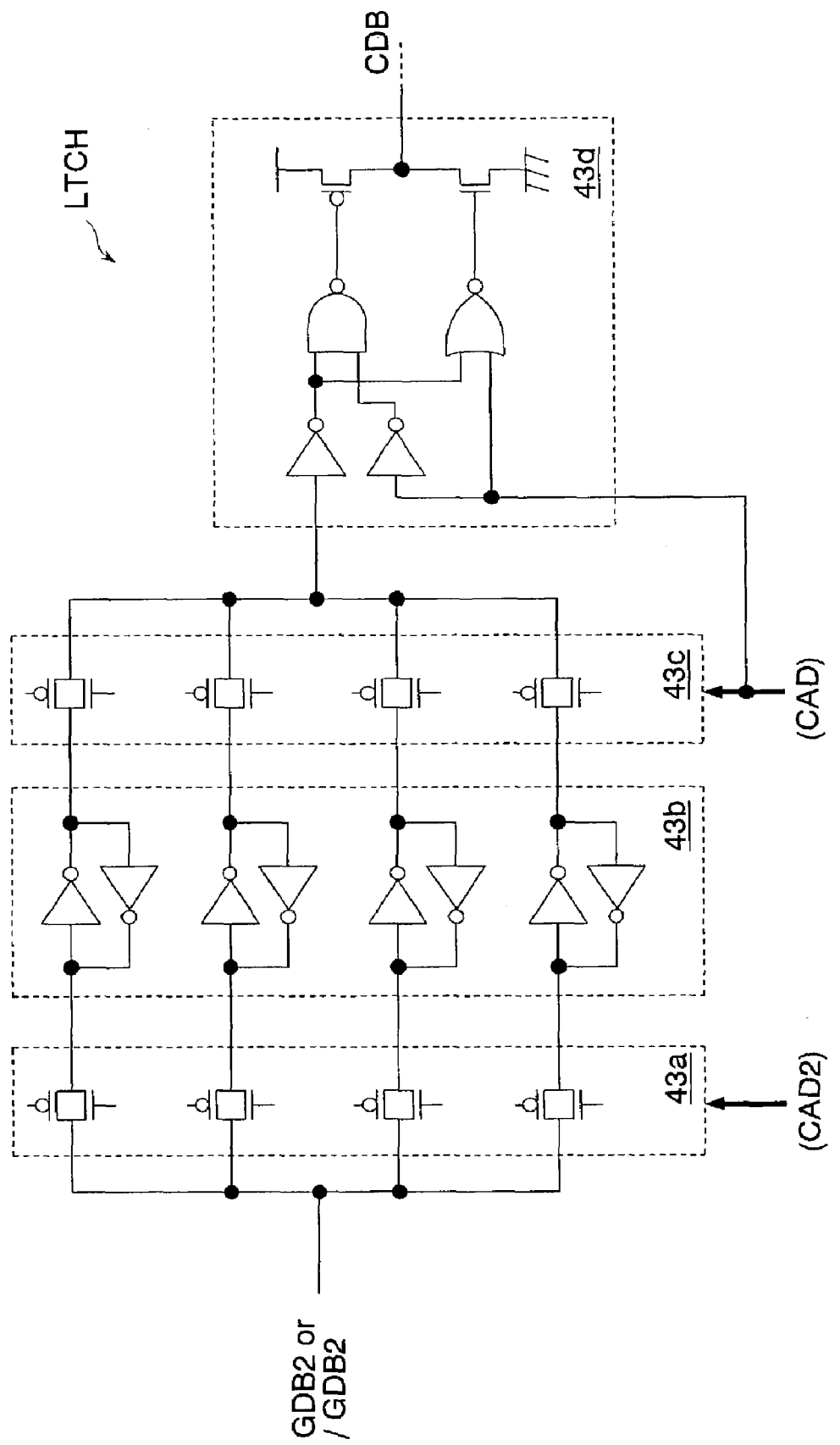
FIG. 12 is a circuit diagram showing the details of a latch unit shown in FIG. 3.

FIG. 12 shows the details of the latch unit LTCH shown in FIG. 3.

The latch unit LTCH has a switch circuit 43a, a latch circuit 43b, a switch circuit 43c, and a buffer circuit 43d corresponding to the amplifier circuit 42b of the amplifier unit AMP shown in FIG. 11.

The switch circuit 43a has four CMOS transmission gates which successively turn on in accordance with the column address signals CAD2, connecting the global data bus line GDB2 (or /GDB2) to the latch circuit 43b. The latch circuit 43b has four latches each of which consists of two inverters having their inputs and outputs connected to each other and latches data transmitted through the switch circuit 43a. The switch circuit 43c has four CMOS transmission gates which successively turn on in accordance with the column address signal CAD (lower bits), connecting the outputs of the latches in the latch circuit 43b to the buffer circuit 43d in succession.

The buffer circuit 43d has a pMOS transistor and an nMOS transistor connected in series between the power supply line and the ground line so that the data output from the switch circuit 43c is output in accordance with the column address signal CAD (an upper bit).

Figure 13:
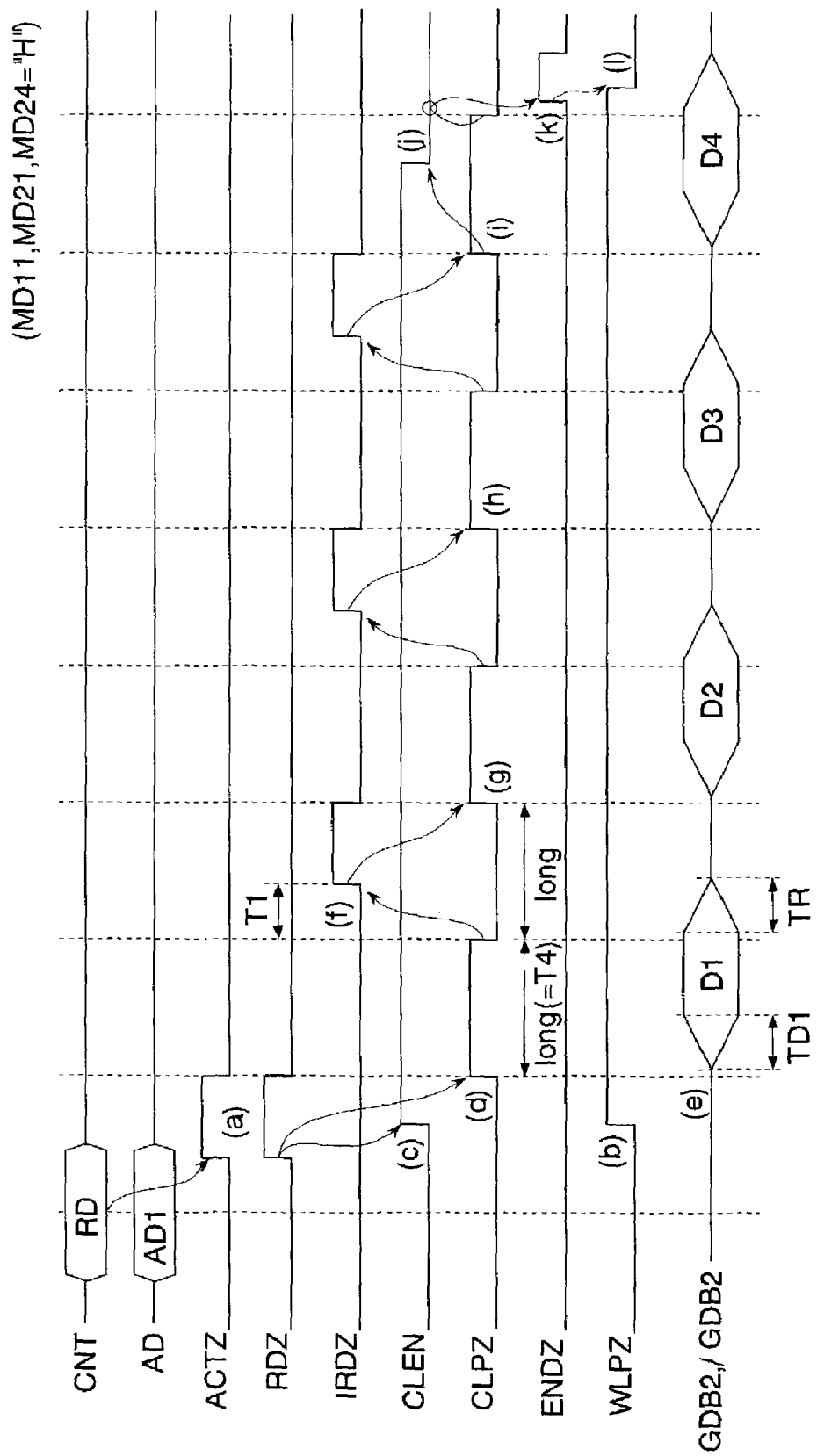
FIG. 13 is a timing chart showing an example of a read operation in the first embodiment.

FIG. 13 shows an example of a read operation in the first embodiment.

In this example, the mode setting circuit 12 has the first mode in which the number of column pulses CLPZ is set to "4" and the second mode in which the pulse width and pulse interval of the column pulses CLPZ is set to "long". The mode setting circuit 12 thus outputs the first mode signal MD11 of high level and the second mode signals MD24 and MD21 of high level. This indicates a state where upon the power-on of the FCRAM the mode setting circuit 12 is initialized based on the information of the fuses FS1–2 of the programming circuit 14. As above, the initial mode of the FCRAM can be set freely in accordance with the programming of the fuses FS1–2.

Initially, the FCRAM receives a read command RD and a read address AD1. The read address AD1 is the top address of 4-bit data to be read in succession. The command decoder 10 shown in FIG. 3 outputs the active signal ACTZ and the read control signal RDZ in response to the read command RD (FIG. 13(a)). The word control circuit 30 changes the word pulse WLPZ to high level in response to the active signal ACTZ (FIG. 13(b)). A word line WL corresponding to the read address AD1 is selected in response to the word pulse WLPZ, so that read data is output from a plurality of memory cells MC connected to the word line WL (described in FIG. 14 to be seen later).

The column counter 22 changes the column enable signal CLEN to high level in response to the read control signal RDZ (FIG. 13(c)). The pulse generator 26 outputs a first column pulse CLPZ in response to the read control signal RDZ (FIG. 13(d)). The pulse generator 26 generates a column pulse CLPZ with longer pulse width (T4 shown in FIG. 7) in accordance with the second mode signal MD24 of high level.

A column selecting line CL corresponding to the read address AD1 is selected in response to the column pulse CLPZ, so that the read data is output to the global data bus lines GDB2 and /GDB2 through the local data bus lines RLDB and the global data bus lines GDB (FIG. 13(e)). Here, the read amplifier shown in FIG. 11 turns on the source circuit 42d in accordance with the first driving signal DRV1. Thus, the output time of the read data output from the amplifier circuit 42b to the global data bus lines GDB2 and /GDB2 is TD1 which is longer than when either of the source circuits 42e and 42f is turned on. As a result, the amplification time of the read amplifier is longer than when either of the source circuits 42e and 42f is turned on.

The power consumption of the read amplifier is lower than when either of the source circuits 42e and 42f is turned on. As above, when a reduction is required of the power consumption of the FCRAM, the second mode signals MD21 and MD24 are selected so that the generation cycle of the column pulses CLPZ is extended to reduce the power consumption of the read amplifier. Incidentally, in this embodiment, the reset time TR of the global data bus lines GDB2 and /GDB2 is set to a fixed value regardless of the operation mode since it has no effect on the cycle time.

The interval adjusting circuit 24 outputs the internal read control signal IRDZ in response to the falling edge of the column pulse CLPZ (FIG. 13(f)). The interval adjusting circuit 24 activates the logic circuit 24b shown in FIG. 4 in accordance with the second mode signal MD21 of high level, thereby extending the interval between the falling edge of the column pulse CLPZ and the internal read control signal IRDZ (T1 shown in FIG. 5).

The pulse generator 26 outputs a second column pulse CLPZ in response to the internal read control signal IRDZ (FIG. 13(g)). The pulse interval of the column pulses CLPZ becomes longer in accordance with the second mode signal MD21 of high level. This maximizes the generation cycle of the column pulses CLPZ. Then, third and fourth column pulses CLPZ are output (FIG. 13(h, i)). That is, in response to a single read command RD, the FCRAM generates the column pulse CLPZ a plurality of times automatically without supply of external signals.

The column counter 22 receives the fourth column pulse CLPZ and changes the column enable signal CLEN to low level (FIG. 13(j)). The pulse generator 26 is inactivated by the column enable signal CLEN of low level, stopping generating a column pulse CLPZ.

The word reset control circuit 28 receives the column pulse CLPZ of low level and the column enable signal CLEN of low level, and outputs the end signal ENDZ (FIG. 13(k)). The word control circuit 30 changes the word pulse WLPZ to low level in response to the end signal ENDZ (FIG. 13(l)). Then, the word line WL is deselected to complete the read operation corresponding to the single read command RD. Since the word line WL is deselected in response to the last column pulse CLPZ, the selecting period of the word line WL can be set optimally. As a result, read data can be read from the memory cells with reliability, and the data read out to the bit lines BL and /BL can be surely restored in the memory cells MC.

Figure 14:
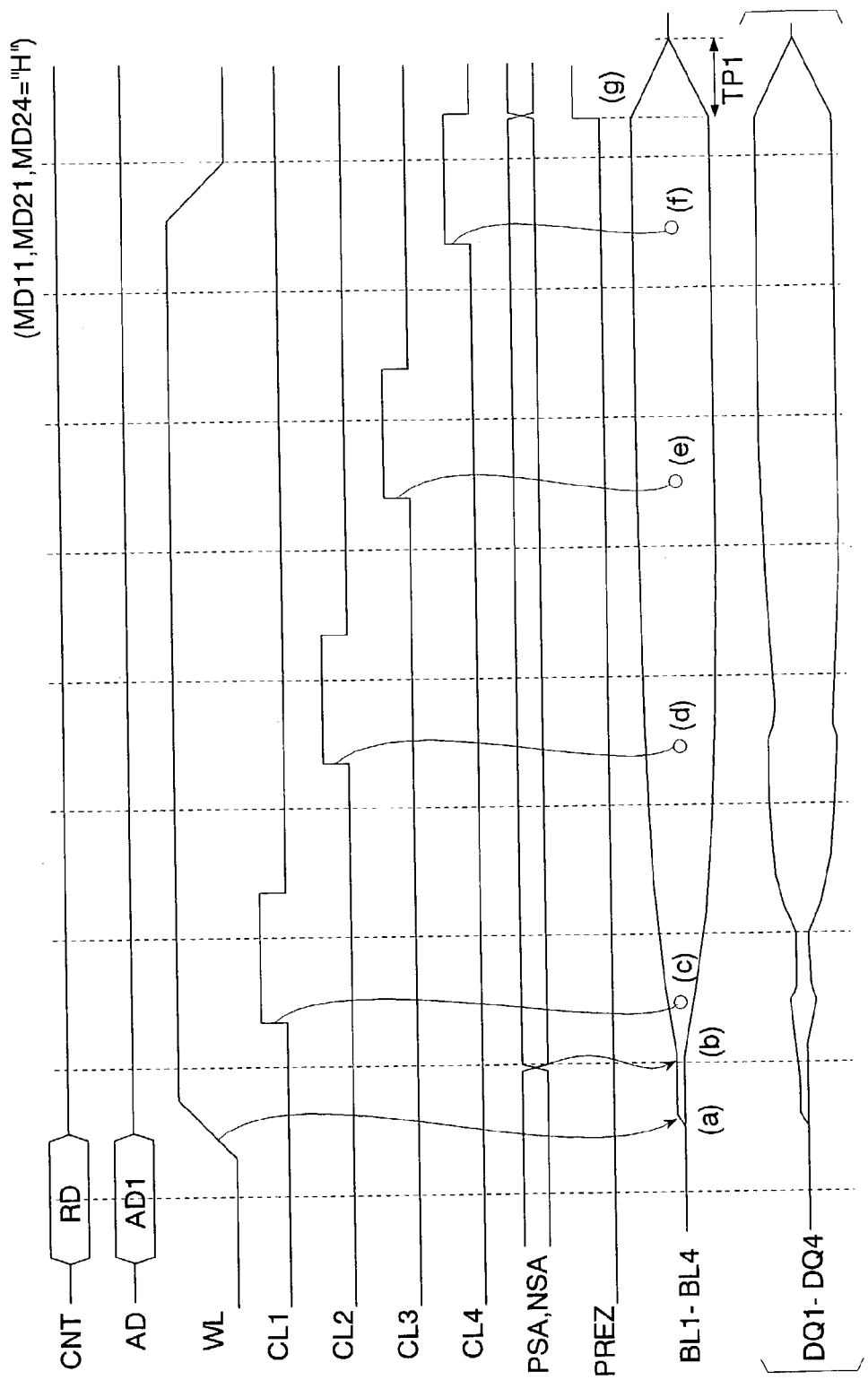
FIG. 14 is a timing chart showing the output of data in the read operation shown in FIG. 13.

FIG. 14 shows the output of data in the read operation shown in FIG. 13.

The bit lines BL1–4 denote the bit line pairs BL, /BL corresponding to the column selecting lines CL1–4 in the memory block BLK1 of FIG. 8. The bit lines BL1–4 are collectively represented by a single waveform since changes in their waveforms will be identical to one another when the memory cells MC retain the same logic of data.

When the read command RD is supplied to select the word line WL, data is read out to the bit lines BL1–4 (FIG. 14(a)). Subsequently, the sense amplifier activating signals PSA and NSA change to activate the sense amplifiers, amplifying the data on the bit lines BL1–4 (FIG. 14(b)). Next, the column selecting lines CL1–4 are successively selected in synchronization with the column pulses CLPZ shown in FIG. 13, so that the data on the bit lines BL1–4 is transmitted to the local data bus lines LDB (FIG. 14(c, d, e, f)).

The data transmitted to the local data bus lines LDB is amplified by the amplifier unit AMP, and latched into the latch unit LTCH in succession in synchronization with the column address signals CAD2. As described in FIG. 12, the data latched into the latch unit LTCH is output to the common data bus line CDB and output through the data terminal DQ in accordance with column address signals CAD successively supplied from the exterior of the FCRAM. That is, a page operation is performed. Note that FIG. 14 shows none of the column address signals CAD that are supplied to the latch unit LTCH in association with the column selecting lines CL2, CL3, and CL4.

The end signal ENDZ (seen previously in FIG. 13(k)) is output to deselect the word line WL before the precharging signal PREZ is output to precharge the bit lines BL1–4 (FIG. 14(g)). Here, when the second mode signals MD21 and MD24 are at high level, the first precharging circuit 40b having a transistor of the minimum size operates as described in FIG. 10. Consequently, the time TP1 for which the bit lines BL1–4 are precharged is longer than when the second or third precharging circuit 40c, 40d is in operation. As a result, the power consumption of the precharging unit PRE decreases as compared to when either of the second and third precharging circuits 40c and 40d is in operation. This reduces the power consumption of the FCRAM.

Incidentally, since the direct sense system is adopted in this embodiment, data can be read with reliability even when the data on the bit lines BL1–4 is not amplified sufficiently as shown in FIG. 14(c, d). Besides, the bit lines BL1–4 are free from the effect of the local data bus lines LDB when the column selecting lines CL1–4 are selected. Shown in the brackets in the diagram are the waveform of the bit lines BL1–4 for situations where column switches not of direct sense system are used with their sources and drains connected to the bit lines and local data bus lines. In this case, the bit lines BL1–4 fluctuate in voltage under the effect of the local data bus lines LDB when the column selecting lines CL1–4 are selected. Consequently, the column selecting lines CL1–4 must be selected after the bit lines BL1–4 are amplified sufficiently, which means increases in the cycle time.

Figure 15:
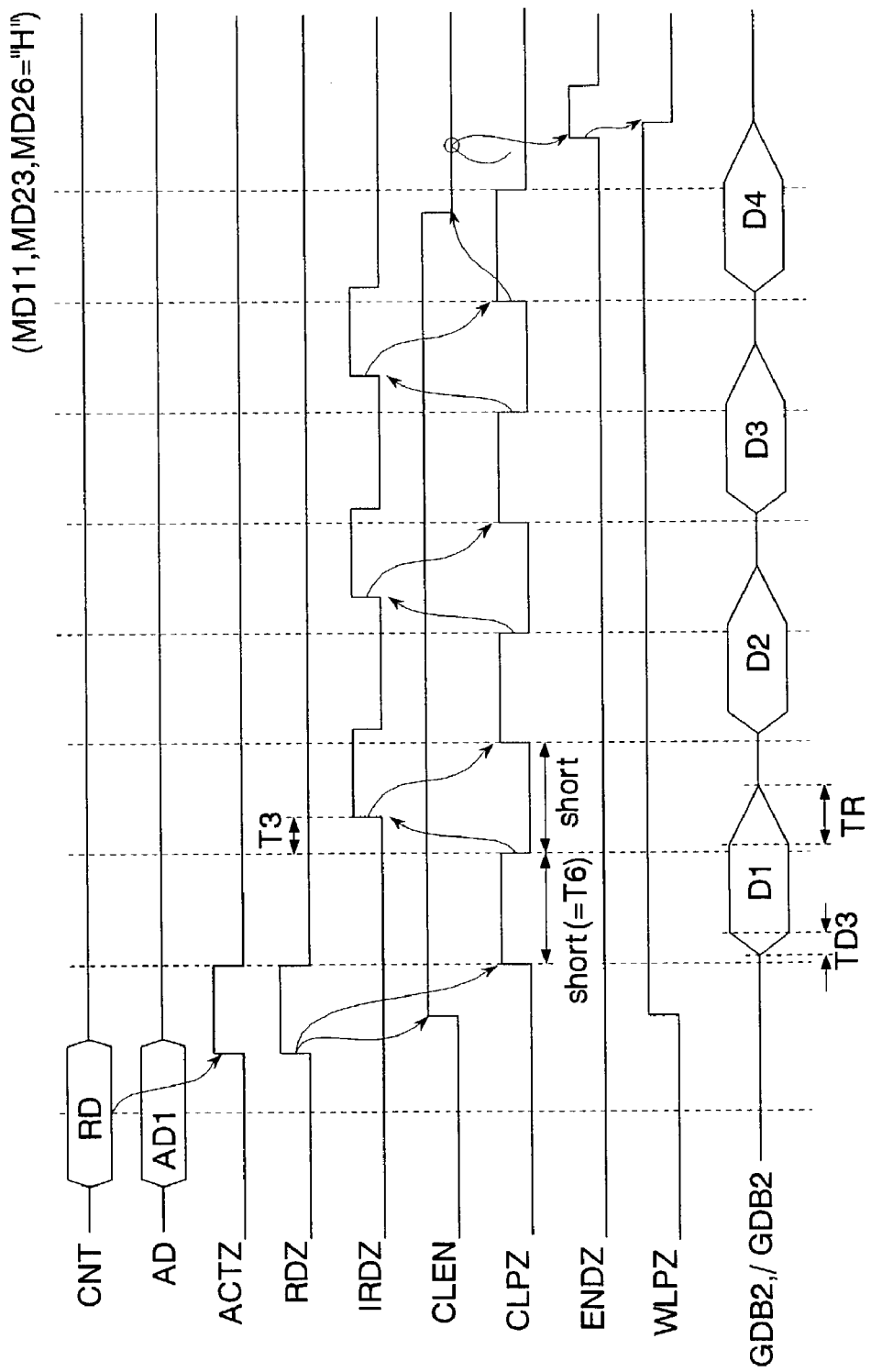
FIG. 15 is a timing chart showing another example of the read operation in the first embodiment.

FIG. 15 shows another example of the read operation in the first embodiment. Description will be omitted of the same operations as in FIG. 13.

In this example, the mode setting circuit 12 has the first mode in which the number of column pulses CLPZ is set to "4" and the second mode in which the pulse width and pulse interval of the column pulses CLPZ are set to "short". The mode setting circuit 12 thus outputs the first mode signal MD11 of high level and the second mode signals MD26 and MD23 of high level. This indicates a state where the mode setting circuit 12 is set again in response to an address signal AD that is supplied along with a mode setting command after the FCRAM is powered on.

In this example, the pulse generator 26 generates a column pulse CLPZ of shorter pulse width (T6 shown in FIG. 7) in accordance with the second mode signal MD26 of high level. The interval adjusting circuit 24 sets the interval between the falling edge of the column pulse CLPZ and the internal read control signal IRDZ shorter (T3 shown in FIG. 5) in accordance with the second mode signal MD23 of high level. Consequently, the pulse interval of the column pulse CLPZ decreases in accordance with the second mode signal MD23 of high level. This minimizes the generation cycle of the column pulses CLPZ.

The read amplifier shown in FIG. 11 turns on the source circuit 42f in accordance with the third driving signal DRV3. Thus, the output time TD3 of the read data output from the amplifier circuit 42b to the global data bus lines GDB2 and /GDB2 becomes shorter than when either of the source circuits 42d and 42e is turned on. Consequently, yet with an increase in the power consumption thereof, the read amplifier can be reduced in the amplification time. As above, a reduction in the cycle time of the FCRAM is realized by selecting the second mode signals MD23 and MD26 so as to reduce the generation cycle of the column pulses CLPZ and reduce the amplification time of the read amplifier.

Figure 16:
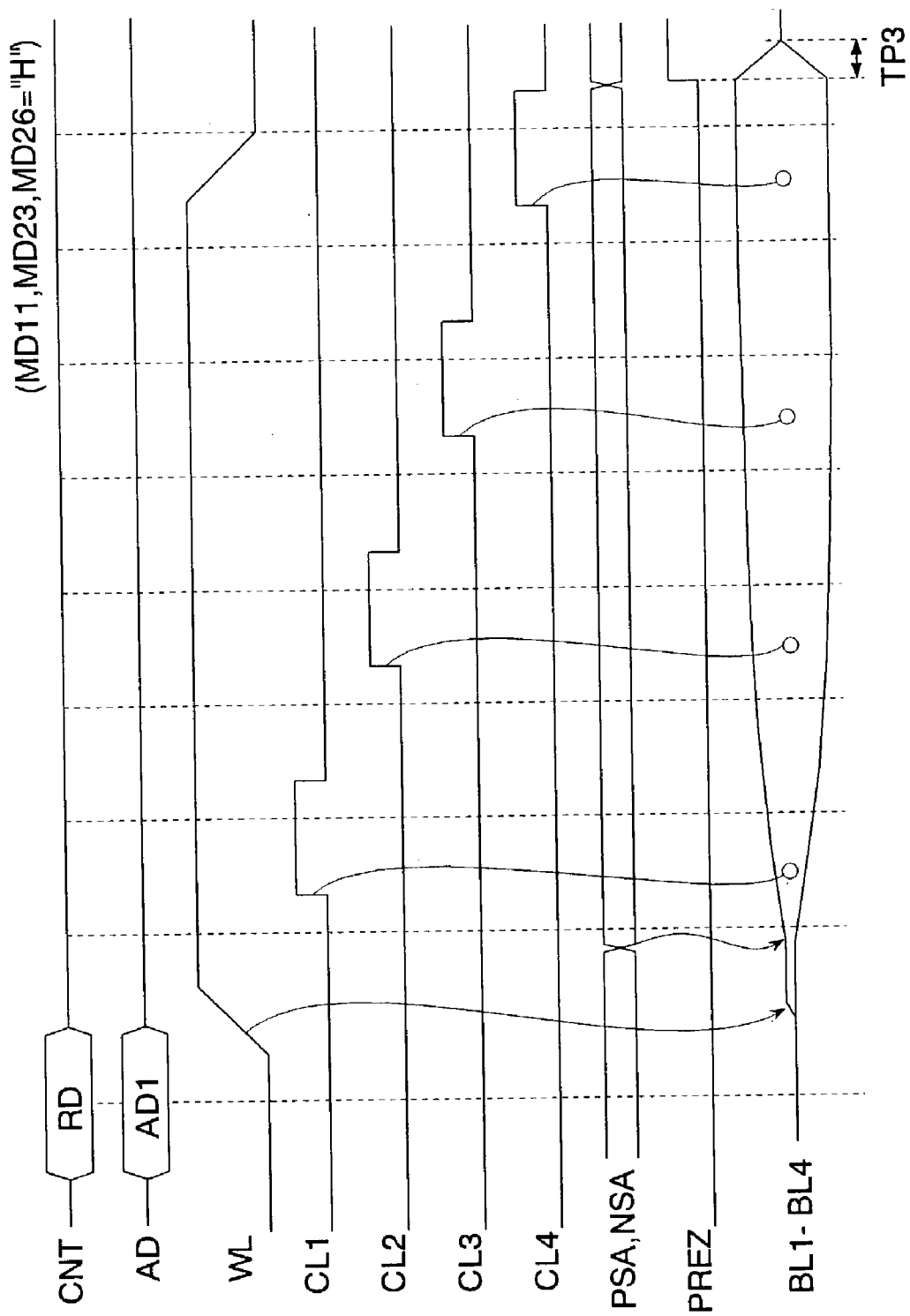
FIG. 16 is a timing chart showing the output of data in the read operation shown in FIG. 15.

FIG. 16 shows the output of data in the read operation shown in FIG. 15. Description will be omitted of the same operations as in FIG. 14.

In this example, the cycle in which the column selecting lines CL1–3 are selected decreases since the generation cycle of the column pulses CLPZ is short. As described in FIG. 10, the precharge operation subsequent to the read operation is performed by the third precharging circuit 40d having a transistor of the maximum size. Consequently, the time TP3 for which the bit lines BL1–4 are precharged becomes shorter than when the first or second precharging circuit 40b, 40d is in operation. Consequently, yet with an increase in the power consumption of the precharging unit PRE, the precharge operation can be accelerated. It is therefore possible to reduce the cycle time in the read operation.

Figure 17:
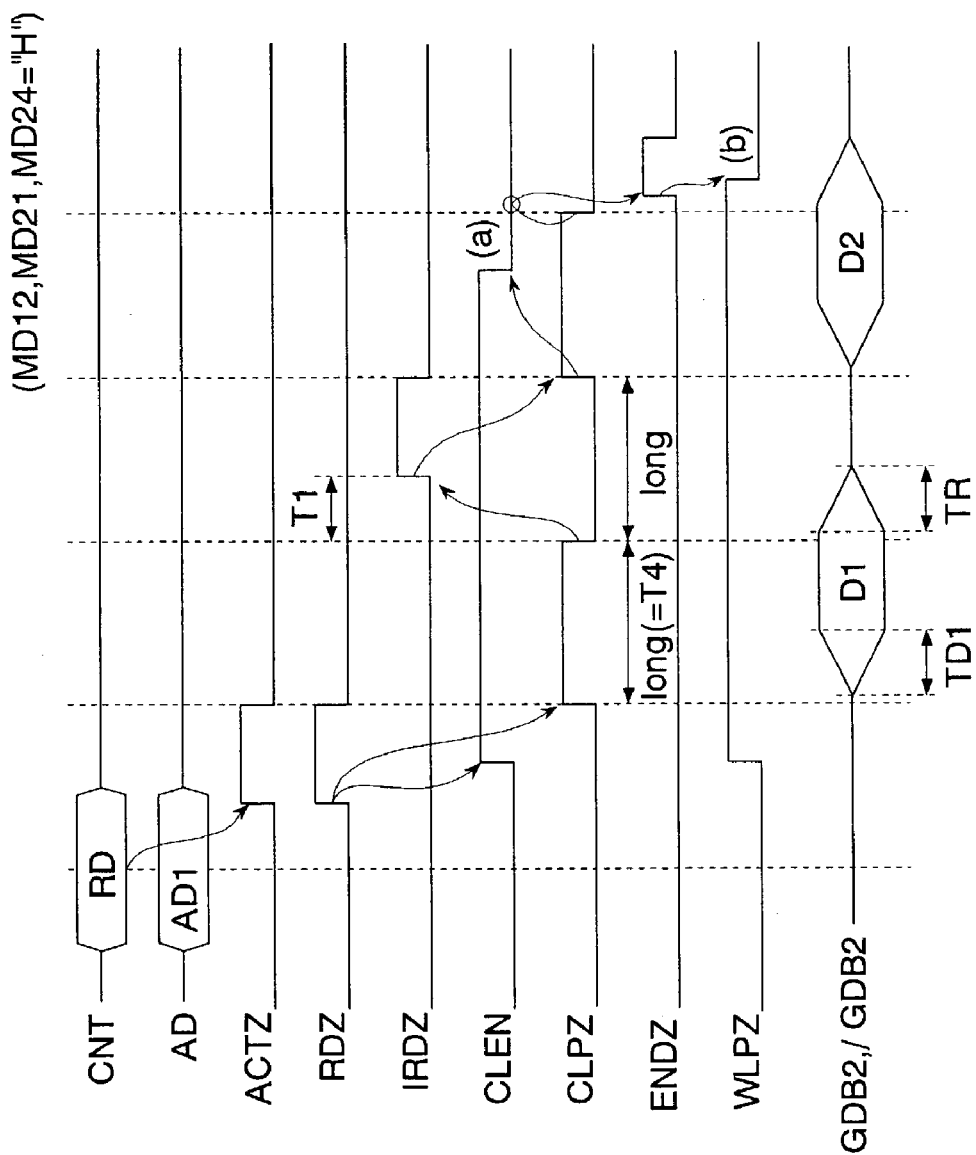
FIG. 17 is a timing chart showing another example of the read operation in the first embodiment.

FIG. 17 shows another example of the read operation in the first embodiment. Description will be omitted of the same operations as in FIG. 13.

In this example, the mode setting circuit 12 has the first mode in which the number of column pulses CLPZ is set to "2" and the second mode in which the pulse width and pulse interval of the column pulses CLPZ are set to "long". The mode setting circuit 12 thus outputs the first mode signal MD12 of high level and the second mode signals MD24 and MD21 of high level.

The column counter 22 shown in FIG. 3 receives the first mode signal MD12 of high level, and changes the column enable signal CLEN to low level in synchronization with the rising edge of the second column pulse CLPZ (FIG. 17(a)). The end signal ENDZ is thus output after the column pulse CLPZ is generated twice. The word pulse WLPZ changes to low level in synchronization with the end signal ENDZ (FIG. 17(b)). Consequently, two pieces of data D1 and D2 are output to the global data bus lines GDB2 and /GDB2.

The end signal ENDZ is always generated in response to the last column pulse CLPZ. The deselecting timing of the word line WL thus is optimum even if the number of times the column pulse CLPZ is output is changed.

As above, in the first embodiment, the column pulse CLPZ is generated a plurality of times in response to a single read command RD. Column address signals CAD2 are generated from the address signal AD that is supplied along with the read command RD. As a result, the column selecting lines CL can be selected in succession automatically inside the FCRAM. Data read from the memory cells MC to the bit lines BL and /BL is successively transmitted to a common local data bus line LDB through the column switches CSW. A plurality of bits of read data read from the memory cells MC in response to a single read command RD can thus be transmitted through a single local data bus line LDB. It is therefore possible to minimize the numbers of local data bus lines LDB and global data bus lines GDB, and prevent the FCRAM from increasing in chip size. Moreover, since a plurality of bits of data can be transmitted through a single local data bus line LDB, the number of memory blocks to be activated in response to a read command RD can be reduced with a reduction in the power consumption of the FCRAM during operation.

Since the column pulse CLPZ and the column address signal CAD2 are generated a plurality of times automatically inside the FCRAM, the signals to be supplied from the exterior of the FCRAM for the sake of read operations can be minimized. As a result, it is possible to lower the frequency of operations of the input circuit and the like connected to the external terminals, allowing a reduction in power consumption while maintaining high speed operation.

As for the column pulses CLPZ the pulse generator 26 generate, the number of pulse outputs, the pulse width, and the pulse interval can be set freely by the mode setting circuit 12. A plurality of types of FCRAMs having different data output specifications can thus be made using the single type of chip. As a result, the FCRAM can be improved in development efficiency with a reduction in development cost.

Since the column pulses CLPZ are output by the interval adjusting circuit 24 and the pulse generator 26 being operated in accordance with the column enable signal CLEN output from the column counter 22, the interval adjusting circuit 24 and the pulse generator 26 can be configured simply.

Since the column switches CSW of direct sense system are adopted, the time for restoring data to the memory cells MC will not get longer even when a plurality of column pulses CLPZ are successively generated to turn on the column switches CSW in succession. This can avoid an increase in the read cycle time.

The word lines WL are deselected in response to the last column pulse CLPZ out of the column pulses CLPZ generated in response to a read command RD. The word lines WL can thus be deselected at optimum timing regardless of the number of outputs or the generation cycle of the column pulses CLPZ. As a result, it is possible to minimize the cycle time in read operations.

Similarly, the precharging of the bit lines BL and /BL is started in response to the last column pulse CLPZ out of the column pulses CLPZ generated in response to a read command RD. The bit lines BL and /BL can thus be precharged at optimum timing regardless of the number of outputs or the generation cycle of the column pulses CLPZ. As a result, it is possible to minimize the cycle time in read operations.

The number of outputs, the pulse width, and the pulse interval of the column pulses CLPZ can be initialized by the fuse signals FUS1–2. The number of outputs, the pulse width, and the pulse interval of column pulses can thus be set in accordance with the product specifications (operating frequency, power consumption, etc.) of the FCRAM before the shipment of the FCRAM. This is particularly useful for classifying FCRAMs fabricated using the same photomask and fabrication processes into a plurality of products for shipping in accordance with their actual power consumptions (or operating frequencies).

The number of outputs, the pulse width, and the pulse interval of the column pulses CLPZ can be not only initialized by the fuse signals FUS1–2 but also set in accordance with an address signal AD supplied through the address terminal. It is therefore possible to set the number, the pulse width, and the pulse interval of column pulses in accordance with the specifications of the system for the FCRAM to be mounted on. In other words, users of the FCRAM can set the number, the pulse width, and the pulse interval of column pulses freely in accordance with the user specifications.

The read amplifiers of the amplifier unit AMP has higher amplification power when the generation cycle of the column pulses CLPZ is short than when the generation cycle is long. The read amplifiers can thus amplify the data on the data bus lines LDB, GDB with reliability even when both the generation cycle and the cycle time are short.

Similarly, the precharging circuits of the precharging unit PRE have higher drivability when the generation cycle of the column pulses CLPZ is short than when the generation cycle is long. The precharging circuits can thus precharge the bit lines BL and /BL to a predetermined voltage with reliability even when both the generation cycle and the cycle time are short.

Figure 18:
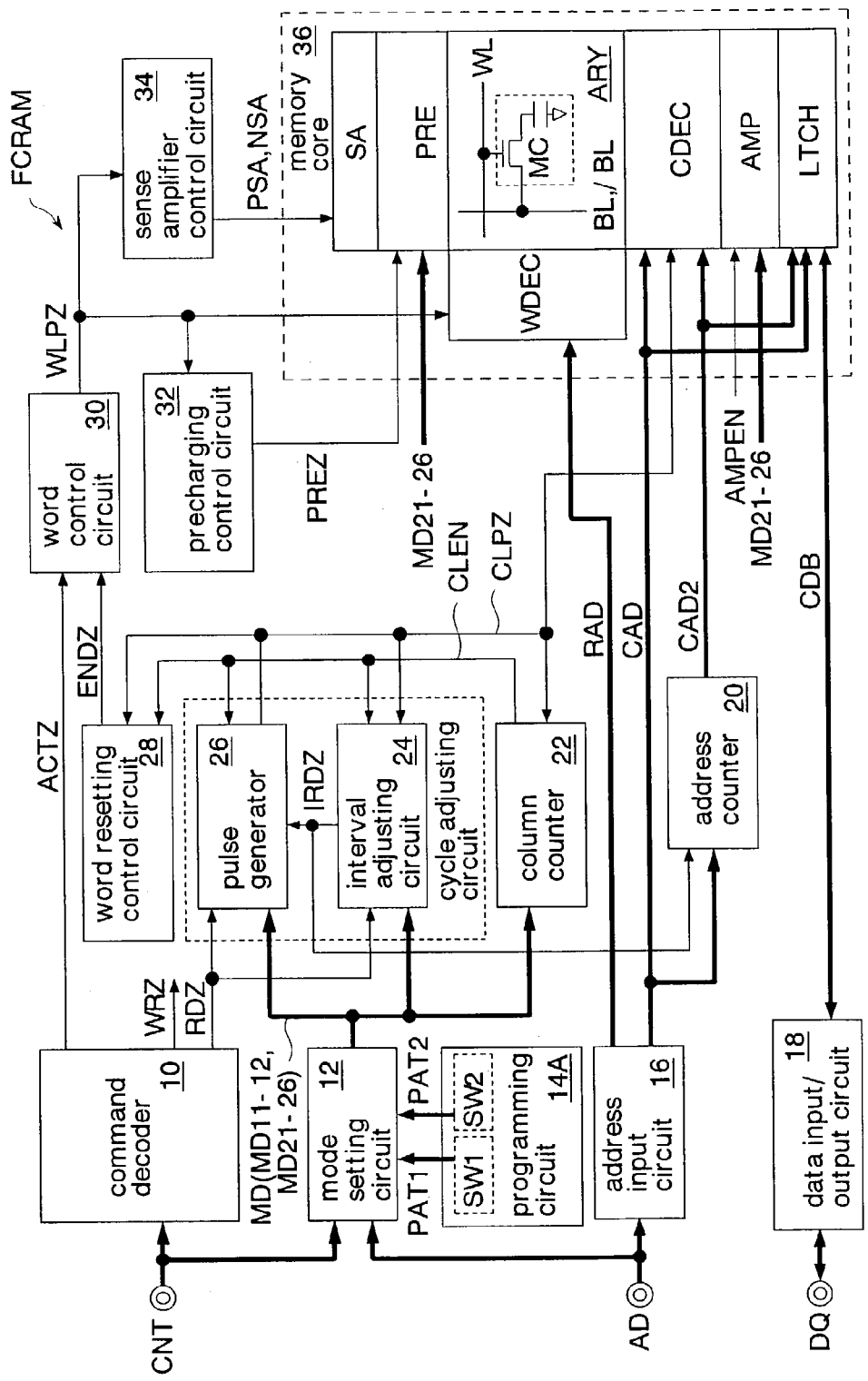
FIG. 18 is a block diagram showing a second embodiment of the present invention.

FIG. 18 shows a second embodiment of the semiconductor memory of the present invention. The same elements as those described in the first embodiment will be designated by identical reference numbers or symbols. Detailed description thereof will be omitted here.

In this embodiment, a programming circuit 14A is formed instead of the programming circuit 14 of the first embodiment. The rest of the configuration is the same as in the first embodiment.

The programming circuit 14A has a first switch SW1 and a second switch SW2 which are made up of a conductive pattern formed on the semiconductor substrate in conformity to the pattern configuration of a photomask to be used in the semiconductor fabrication processes of the FCRAM.

The first switch SW1 outputs a pattern signal PAT1 (first internal setting signal) for indicating an initial value of the number of column pulses CLPZ. The second switch SW2 outputs a pattern signal PAT2 (second internal setting signal) for indicating an initial value of the generation cycle of the column pulses CLPZ. That is, the programming circuit 14A outputs the pattern signals PAT1 and PAT2 according to the first and second switches SW1 and SW2 which are set in accordance with the voltages of destinations of the conductive pattern.

The connection specifications of the first and second switches SW1 and SW2, or the photomask to be used in fabricating the FCRAM, are determined in accordance with the product specifications (operating frequency, power consumption, etc.) of the FCRAM.

The mode setting circuit 12 is initialized in accordance with the logical levels of the pattern signals PAT1 and PAT2 from the programming circuit 14A when the FCRAM is powered on. In the initial state, the number of times the column pulse CLPZ is output set at "4", and the generation cycle of the column pulses CLPZ (pulse width and pulse interval) is set at the maximum. As in the first embodiment, the mode setting circuit 12 can be reset by a mode setting command.

As above, this embodiment can offer the same effects as those of the first embodiment described above. Moreover, in this embodiment, the number of outputs and the generation cycle of the column pulses can be set by simply changing the photomask for the wiring layer in accordance with the product specifications (operating frequency, power consumption, etc.) of the FCRAM. This is particularly useful for differentiating for shipping, by switching photomasks, FCRAMs fabricated using the same fabrication processes as a plurality of different products by power consumption (or operating frequencies).

Figure 19:
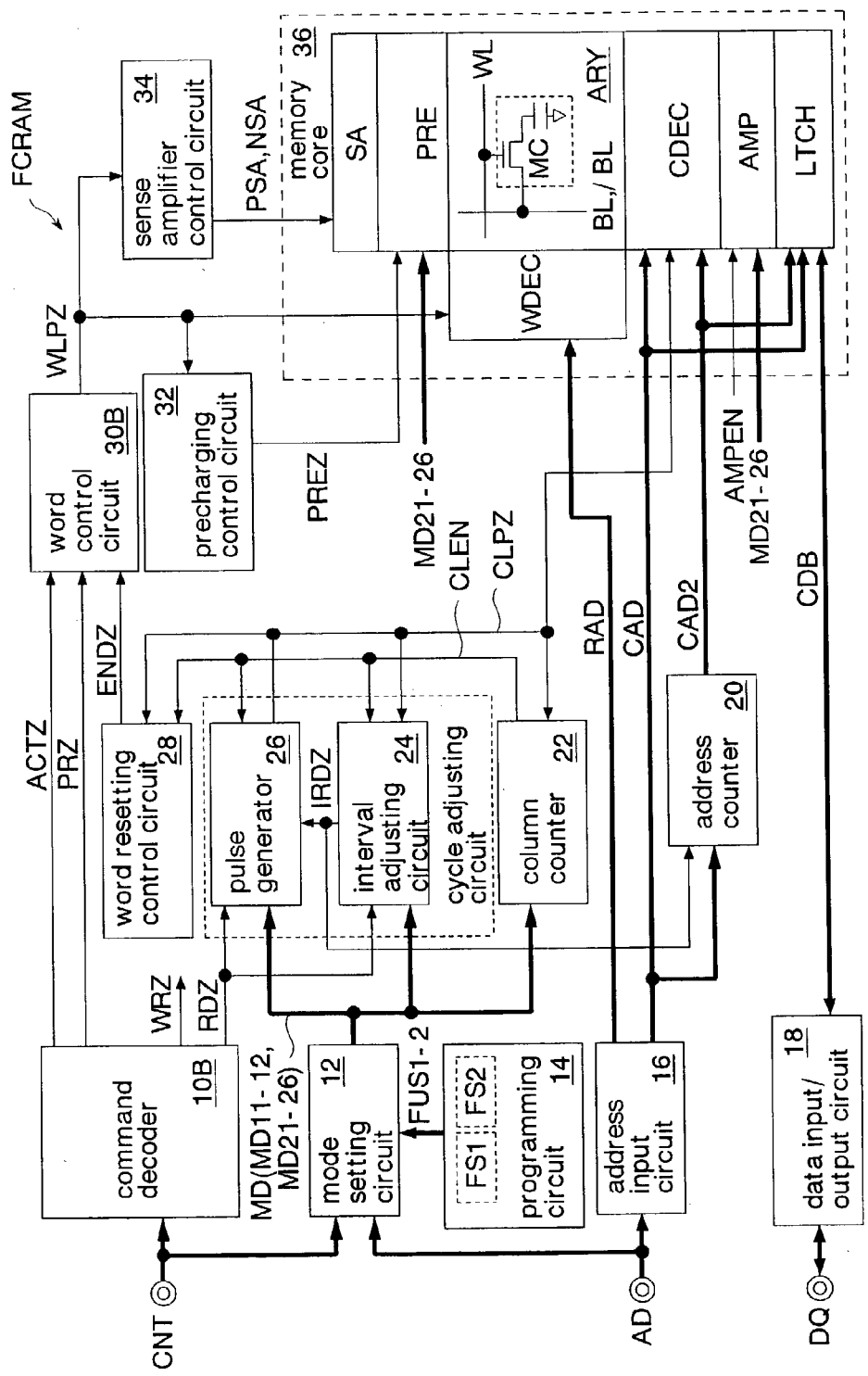
FIG. 19 is a block diagram showing a third embodiment of the present invention.

FIG. 19 shows a third embodiment of the semiconductor memory of the present invention. The same elements as those described in the first embodiment will be designated by identical reference numbers or symbols. Detailed description thereof will be omitted here.

In this embodiment, a command decoder 10B and a word control circuit 30B are formed instead of the command decoder 10 and the word control circuit 30 of the first embodiment. The rest of the configuration is the same as in the first embodiment.

Upon receiving a read command, a write command, and a refresh command, the command decoder 10B outputs the active signal ACTZ. A predetermined time after the outputting, It deselects the word line WL to output a precharging signal PRZ (pulsed signal) for precharging the bit lines BL and /BL. That is, the precharging signal PRZ is a reset signal for deselecting the word lines WL. The command decoder 10B functions as a reset circuit for outputting the reset signal (PRZ).

The word control circuit 30B changes the word pulse WLPZ to high level in response to the active signal ACTZ, and changes the word pulse WLPZ to low level in response to either of the end signal ENDZ and the precharging signal PRZ which arrives late.

Figure 20:
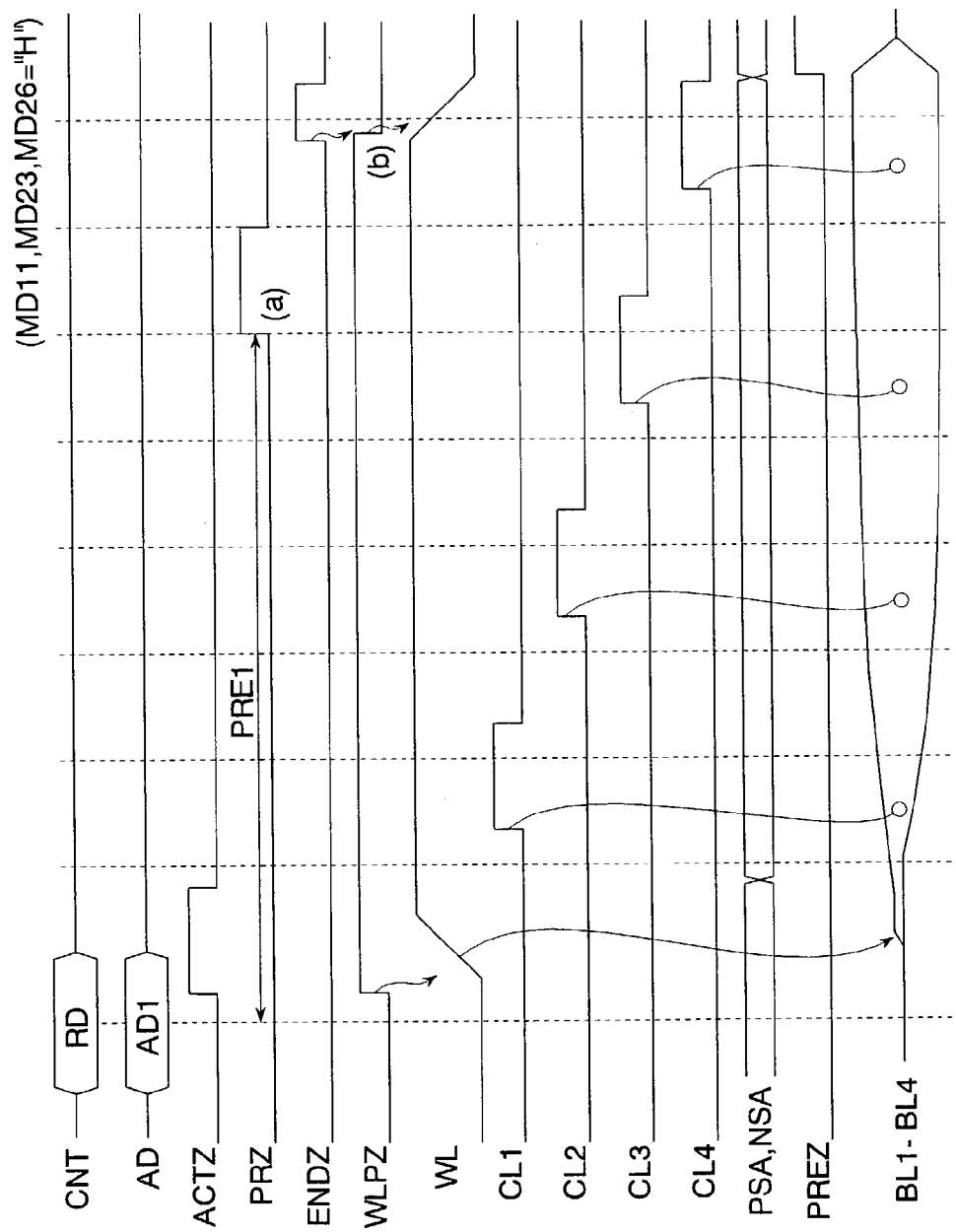
FIG. 20 is a timing chart showing an example of the read operation in the third embodiment.

FIG. 20 shows an example of a read operation in the third embodiment. Description will be omitted of the same operations as in FIG. 16 seen previously (the first embodiment).

In this embodiment, the precharging signal PRZ is output a time PRE1 after the supply of the read command RD (FIG. 20(a)). The word control circuit 30B shown in FIG. 19 receives the end signal ENDZ after the reception of the precharging signal PRZ. Thus, the reset timing (falling edge) of the word pulse WLPZ is set in synchronization with the end signal ENDZ (FIG. 20(b)).

Figure 21:
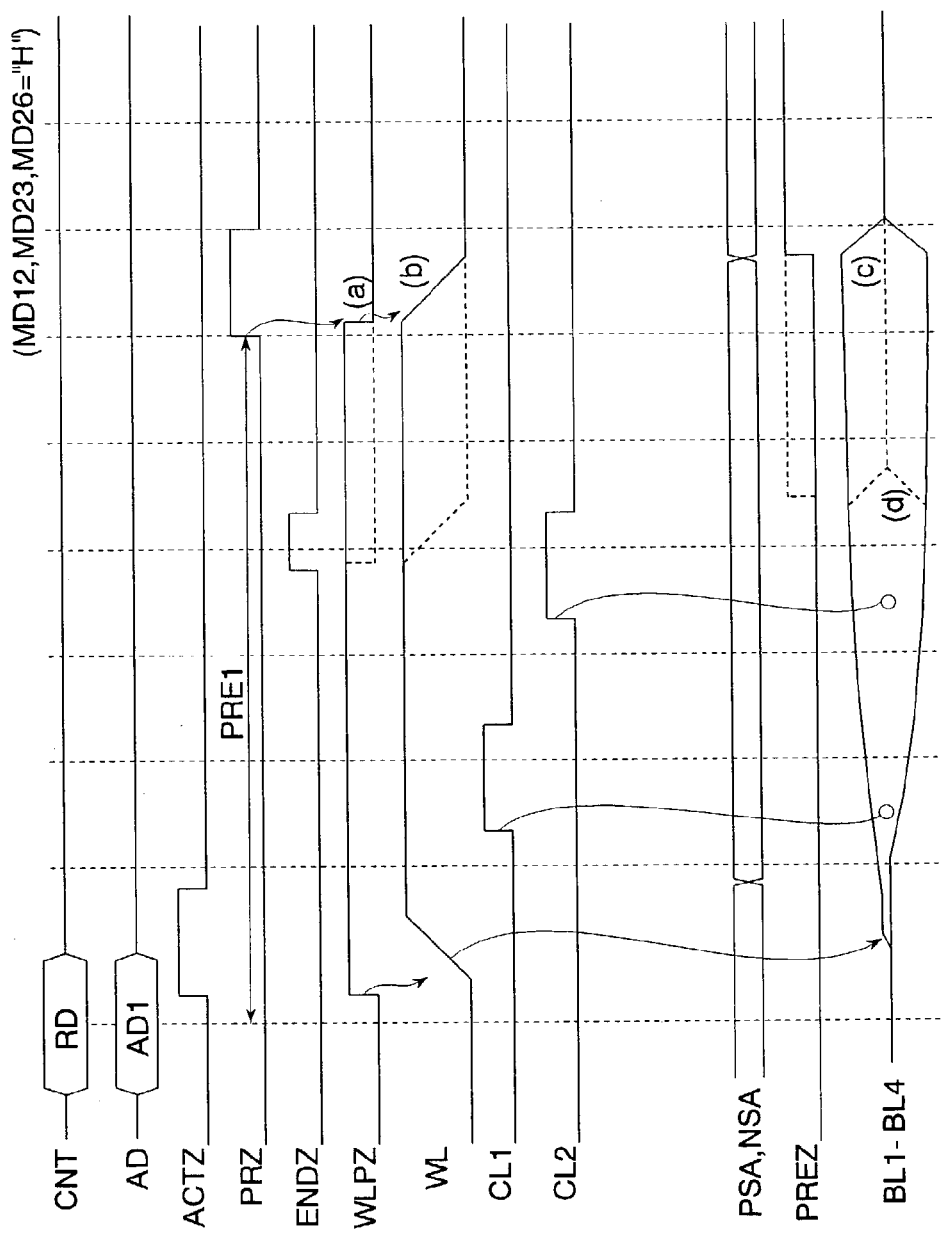
FIG. 21 is a timing chart showing another example of the read operation in the third embodiment.

FIG. 21 shows another example of the read operation in the third embodiment. Description will be omitted of the same operations as in FIG. 16 seen previously (the first embodiment).

In this example, the first mode signal MD12 of high level is output to set the number of times the column pulse CLPZ is output at "2". The word control circuit 30B receives the end signal ENDZ before the reception of the precharging signal PRZ. Thus, the reset timing (falling edge) of the word pulse WLPZ is set in synchronization with the precharging signal PRZ (FIG. 21(a)).

The word line WL is deselected after the voltages of the bit lines BL1–4 are amplified sufficiently (FIG. 21(b)). Consequently, the data on the bit lines BL1–4 is surely restored in the memory cells MC (FIG. 21(c)).

The waveforms in solid lines in the diagram, on the other hand, indicates that the word pulse WLPZ is inactivated in synchronization with the end signal ENDZ. Here, the bit lines BL1–4 are precharged before the voltages of the bit lines BL1–4 are amplified sufficiently (FIG. 21(d)). As a result, the data on the bit lines BL1–4 is restored in the memory cells MC only insufficiently with a deterioration in refresh characteristics. In other words, the data retained by the memory cells MC may possibly disappear before the refresh operation is performed.

As above, this embodiment can offer the same effects as those of the first embodiment described above. Besides, in this embodiment, the deselecting timing of the word line WL and the start timing of the precharge operation are always set at a predetermined time PRE1 after the read command RD. Consequently, restore operations can be surely performed on the memory cells MC so that data is retained in the memory cells MC with reliability.

Figure 22:
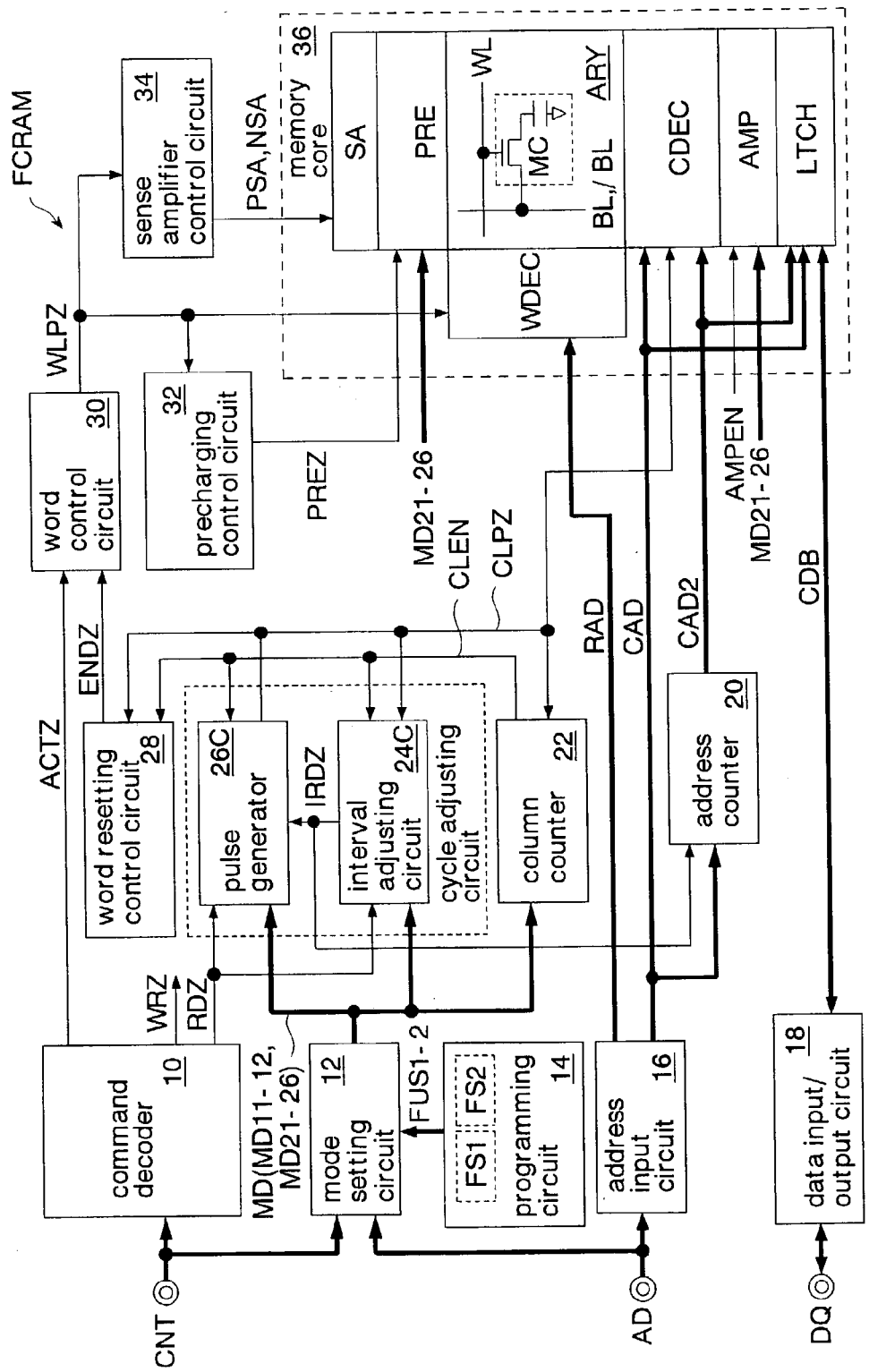
FIG. 22 is a block diagram showing a fourth embodiment of the present invention.

FIG. 22 shows a fourth embodiment of the semiconductor memory of the present invention. The same elements as those described in the first embodiment will be designated by identical reference numbers or symbols. Detailed description thereof will be omitted here.

In this embodiment, an interval adjusting circuit 24C and a pulse generator 26C are formed instead of the interval adjusting circuit 24 and the pulse generator 26 of the first embodiment. The rest of the configuration is the same as in the first embodiment.

The interval adjusting circuit 24C sets the pulse interval of second and subsequent column pulses CLPZ shorter than the pulse interval between the first two column pulses CLPZ. The pulse generator 26C sets the pulse width of the second and subsequent column pulses CLPZ shorter than the pulse width of the first column pulse CLPZ.

Figure 23:
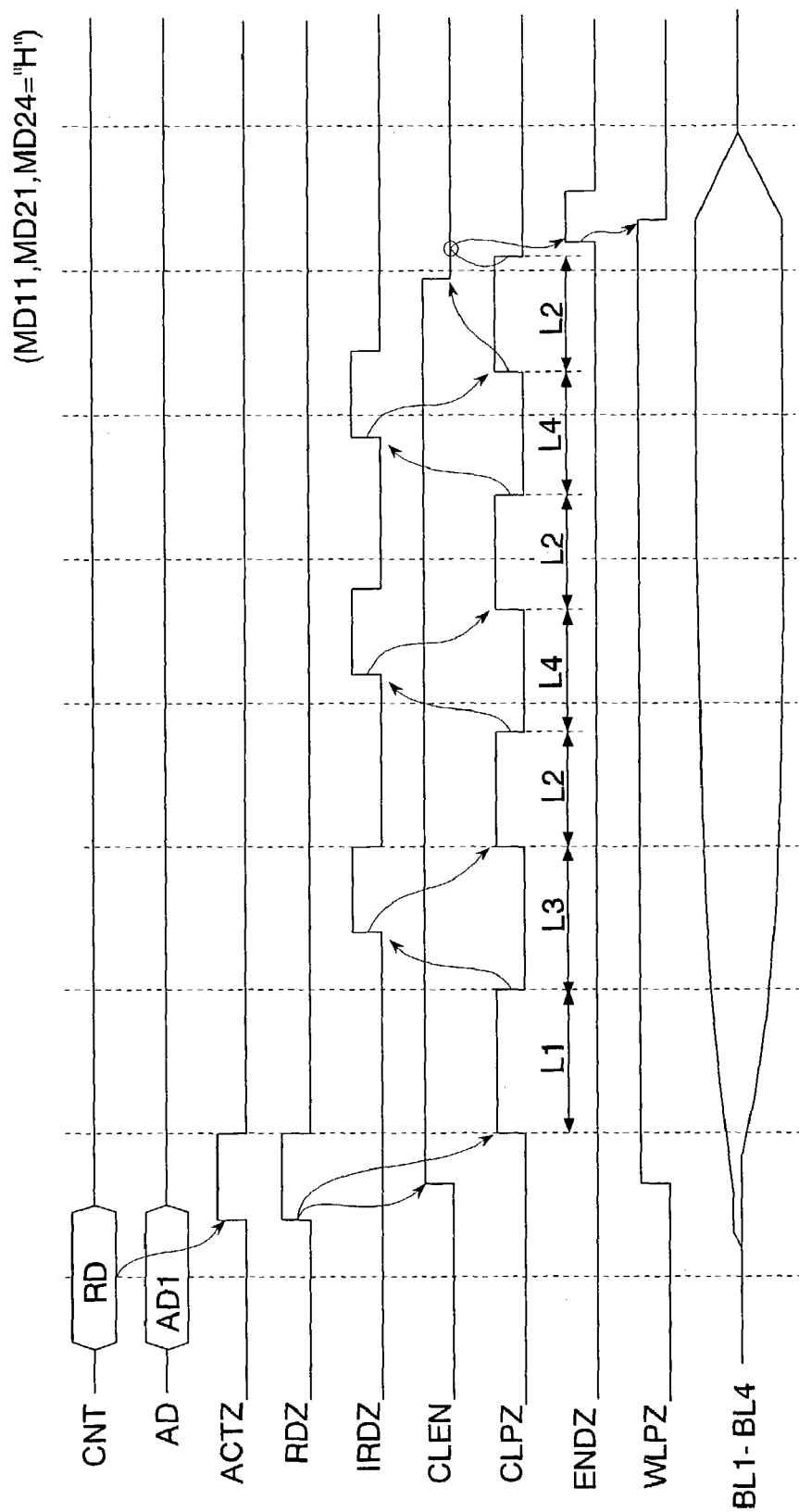
FIG. 23 is a timing chart showing an example of the read operation in the fourth embodiment.

FIG. 23 shows an example of a read operation in the fourth embodiment. Description will be omitted of the same operations as in FIGS. 13 and 14 seen previously (the first embodiment).

In this embodiment, as described above, the pulse width L2 of the second and subsequent column pulses CLPZ is shorter than the pulse width L1 of the first column pulse CLPZ. Moreover, the pulse interval L4 of the second and subsequent column pulses CLPZ is shorter than the pulse interval L3 between the first two column pulses CLPZ.

The first column pulse CLPZ is output immediately after the data on the bit lines BL1–4 starts being amplified. Thus, in order to read the data with reliability, the selecting period of the column selecting line CL corresponding to the column pulse CLPZ must be increased to extend the ON period of the column switches CSW.

On the other hand, the second and subsequent column pulses CLPZ are output after the data on the bit lines BL1–4 is amplified sufficiently. The data can thus be read with reliability even if the selecting periods of the column selecting lines CL corresponding to the column pulses CLPZ are decreased to shorten the ON periods of the column switches CSW. Besides, the cycle in which the second and subsequent column pulses CLPZ is are generated decreases, thereby shortening the cycle time of the read operation.

As above, this embodiment can offer the same effects as those of the first embodiment described above. Moreover, in this embodiment, the generation cycle of the second and subsequent column pulses CLPZ (pulse width and pulse interval) can be reduced to shorten the cycle time corresponding to a single read operation.

Figure 24:
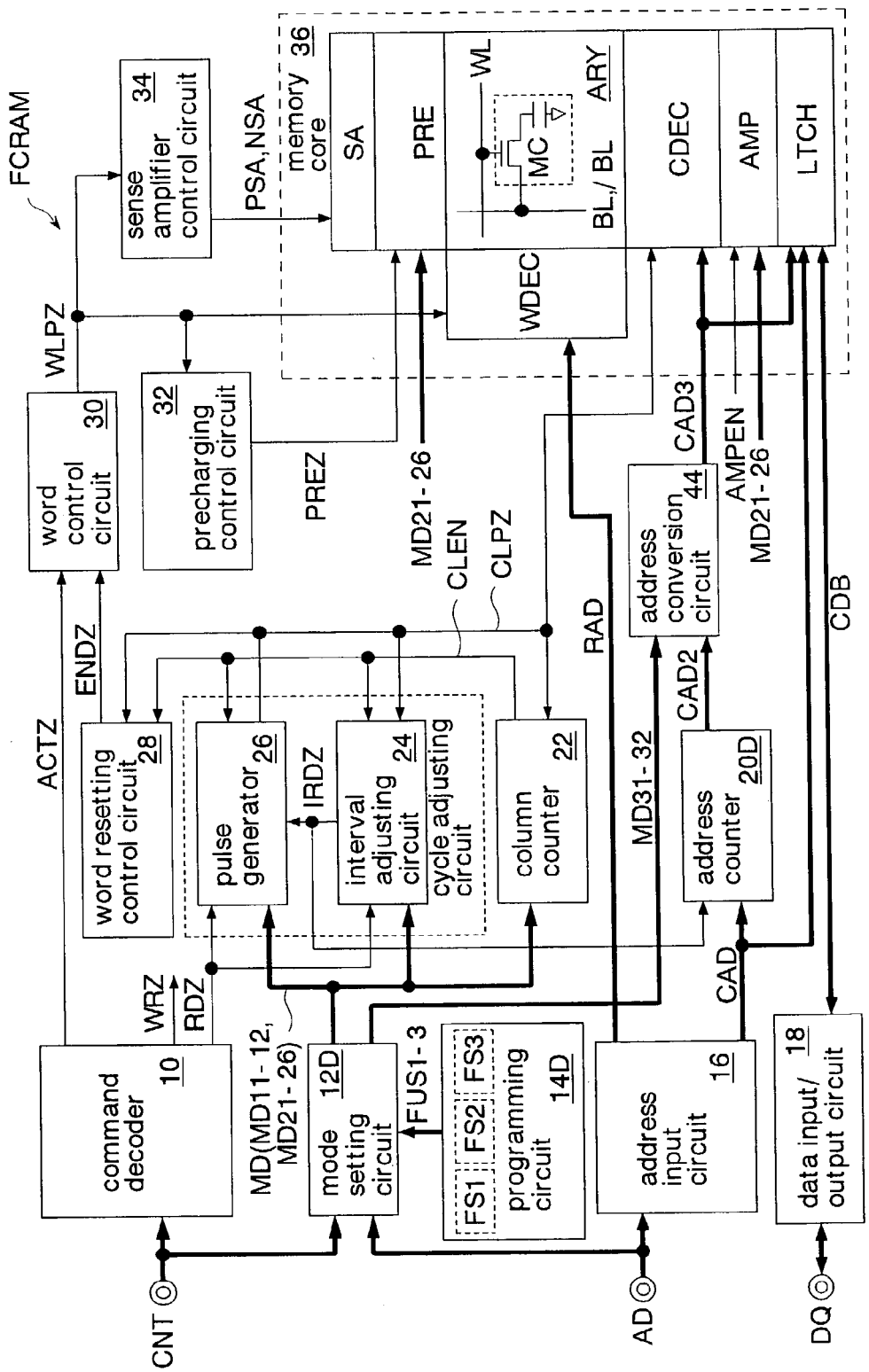
FIG. 24 is a block diagram showing a fifth embodiment of the present invention.

FIG. 24 shows a fifth embodiment of the semiconductor memory of the present invention. The same elements as those described in the first embodiment will be designated by identical reference numbers or symbols. Detailed description thereof will be omitted here.

In this embodiment, a mode setting circuit 12D, a programming circuit 14D, and an address counter 20D are formed instead of the mode setting circuit 12, the programming circuit 14, and the address counter 20 of the first embodiment. In addition, an address conversion circuit 44 is provided between the address counter 20D and the column decoder unit CDEC. The rest of the configuration is almost the same as in the first embodiment.

As in the first embodiment, the mode setting circuit 12D changes either one of the first mode signals MD11–12 to high level and changes any one of the second mode signals MD21–23 and any one of the second mode signals MD24–26 to high level in accordance with the fuse signals FUS1–2 and the first and second setting signals supplied to the address terminal AD. The mode setting circuit 12D also changes either one of third mode signals MD31–32 to high level in accordance with a fuse signal FUS3 and an address signal AD (third setting signal) supplied to the address terminal. The FCRAM enters low power mode when the third mode signal MD31 is at high level, and enters high speed mode when the third mode signal MD32 is at high level.

That is, the mode setting circuit 12D functions as a first mode setting circuit for setting the number of column pulses CLPZ, a second mode setting circuit for setting the generation cycle of the column pulses CLPZ, and a third mode setting circuit for setting the operation mode of the FCRAM at the low power mode or the high speed mode.

The programming circuit 14D has first and second fuses FS1 and FS2 which are the same as in the first embodiment, and a third fuse FS3 which sets the operation mode of the FCRAM at the low power mode or the high speed mode. Then, the programming circuit 14D outputs a fuse signal FUS1 (first internal setting signal) in accordance with the programming of the first fuse FS1, outputs a fuse signal FUS2 (second internal setting signal) in accordance with the programming of the second fuses FS2, and outputs a fuse signal FUS3 (third internal setting signal) in accordance with the programming of the third fuse FS3.

That is, the programming circuit 14D functions as first and second programming circuits for outputting the fuse signals FUS1–2, respectively, and a third programming circuit for outputting the fuse signal FUS3 for indicating the initial state of the operation mode of the FCRAM.

The address counter 20D receives a column address signal CAD of greater bit count than in the first embodiment. Like the address counter 20 of the first embodiment, the address counter 20D has the function of an address counter for incrementing the column address signal CAD by one in synchronization with the internal read control signal IRDZ.

The address conversion circuit 44 receives column address signals CAD2 (internal addresses) from the address counter 20D, swaps bits of the column address signals CAD2 in accordance with the third mode signals MD31–32, and outputs the resultant as column address signals CAD3 (second internal addresses).

Figure 25:
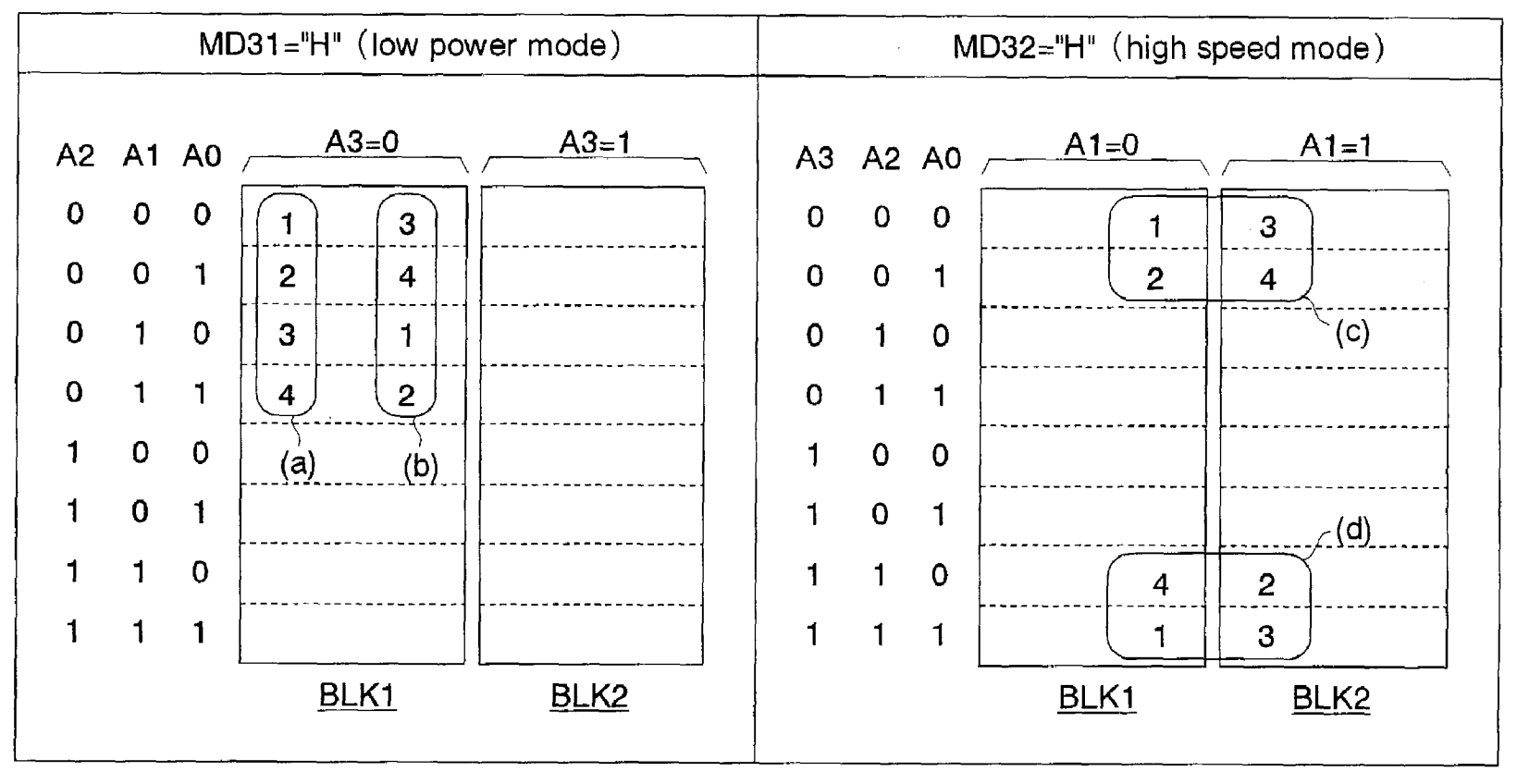

FIG. 25 is an explanatory diagram showing the operation of the address conversion circuit 44 shown in FIG. 24. For ease of explanation, description will be given of two memory blocks BLK1–2 both having 8-bit memory regions (memory cells). In the actual FCRAM, the memory core 36 has the same configuration as in FIG. 8 seen previously. The memory blocks BLK1–2 and the memory regions of these blocks BLK1–2 are identified by four bits of column address A3–0.

When the third mode signals MD31 and MD32 are at high level and low level, respectively (low power mode), the memory blocks BLK1–2 are identified by the most significant address A3. For example, when the address signal AD (top address) supplied along with a read command RD has lower two bits A1–0 of "00", data is read from the memory regions in the order of the numerals in the box (a) in the diagram. When the top address has lower two bits A1–0 of "10", data is read from the memory regions in the order of the numerals in the box (b) in the diagram. As above, in the low power mode, only a single memory block BLK1 (or BLK2) is activated in response to the read command RD. Since the number of memory blocks to be activated is small, the circuits to make simultaneous operation, such as sense amplifiers, can be reduced in number. This means a reduction in power consumption.

The operation of the memory core 36 in the low power mode is shown in FIG. 8 in the above. In the low power mode, as shown in FIG. 8, the column selecting lines CL1–4 in the same memory block (in this example, BLK1) are successively selected in response to a single read command RD, so that read data is output in succession through the common local data bus line LDB and the global data bus line GDB.

Now, when the third mode signals MD31 and MD32 are at low level and high level, respectively (high speed mode), the memory blocks BLK1–2 are identified by the address A1. For example, when the address signal AD (top address) supplied along with a read command RD has lower two bits A1–0 of "00", data is read from the memory regions in the order of the numerals in the box (c) in the diagram. When the top address has lower two bits A1–0 of "01", data is read from the memory regions in the order of the numerals in the box (d) in the diagram. As above, in the high speed mode, the two memory blocks BLK1–2 are activated in response to the read command RD. Since a plurality of memory blocks BLK1–2 can be activated to read data from the memory blocks BLK1–2, respectively, the cycle time can be reduced yet with an increase in power consumption. That is, the read operation can be performed at high speed.

Incidentally, in the present embodiment, the number of memory blocks BLK to be activated varies depending on the operation mode. Although not detailed in FIGS. 24 and 25, the regions of the memory core 36 to be activated depend not only on the row address signal RAD but also on the column address signal CAD. For example, as shown in FIG. 25, the sense amplifier unit of a single memory block BLK is activated in the low power mode. In the high speed mode, the sense amplifier units of two memory blocks BLK are activated. The same holds true for the precharging units, the amplifier units, and the latch units.

Figure 26:
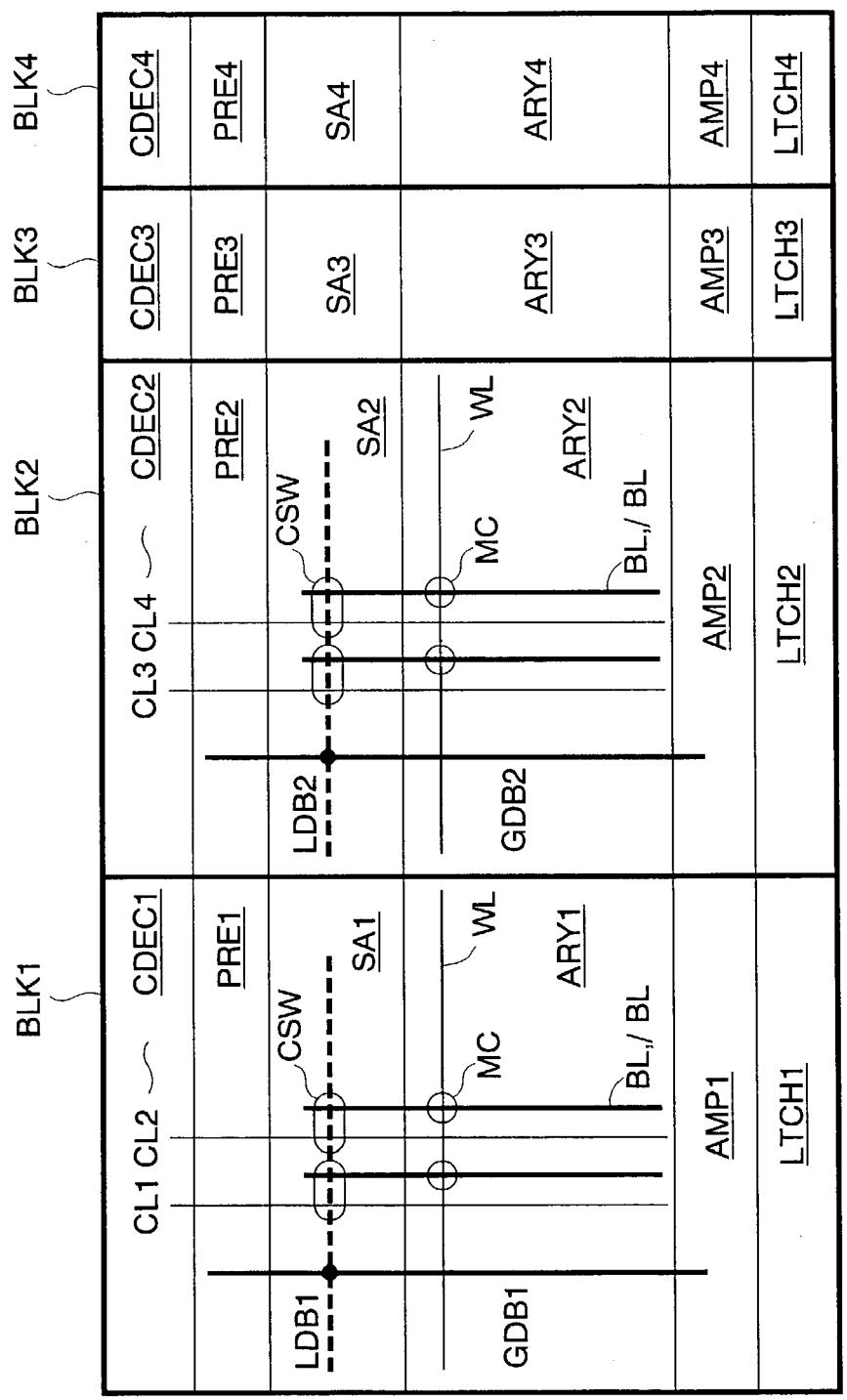
FIG. 26 is an explanatory diagram showing the operation of a memory core of the fifth embodiment in high speed mode.

FIG. 26 shows the operation of the memory core 36 in the high speed mode.

In the high speed mode, column selecting lines CL1–2 and CL3–4 of respective two memory blocks (in this example, BLK1–2) are successively selected in response to a single read command RD. In other words, the column selecting lines CL1 and CL3, and the column selecting lines CL2 and CL4, are selected simultaneously. Then, in each of the memory blocks BLK1–2, read data is output in succession through the common local data bus lines LDB and global data bus lines GDB.

As above, this embodiment can offer the same effects as those of the first embodiment described above. Besides, in this embodiment, the FCRAM is set to the low power mode or the high speed mode by the mode setting circuit 12D. The number of memory blocks BLK to be activated for a read operation in the low power mode is smaller than the number of memory blocks BLK to be activated for a read operation in the high speed mode. Consequently, a single type of FCRAM can be made into a product of low power consumption or a product of high operation speed, allowing a reduction in the development cost and fabrication cost of the FCRAM.

The low power mode or the high speed mode is initially set by the fuse signal FUS3, and can be set in accordance with the address signal AD supplied through the address terminal as well. Consequently, the product specifications (operating frequency, power consumption, etc.) of the FCRAM can be optimized before the shipment of the FCRAM. This is particularly useful when FCRAMs fabricated by using the same photomask and fabrication processes are classified into a plurality of products for shipping in accordance with their actual power consumptions (or operating frequencies).

The low power mode or the high speed mode can be set in accordance with the address signal AD (third setting signal) supplied through the address terminal. Consequently, after the shipment of the FCRAM, the FCRAM can be set to the low power mode or the high speed mode in accordance with the specifications of the system for the FCRAM to be mounted on. This improves the usability of the FCRAM.

Figure 27:
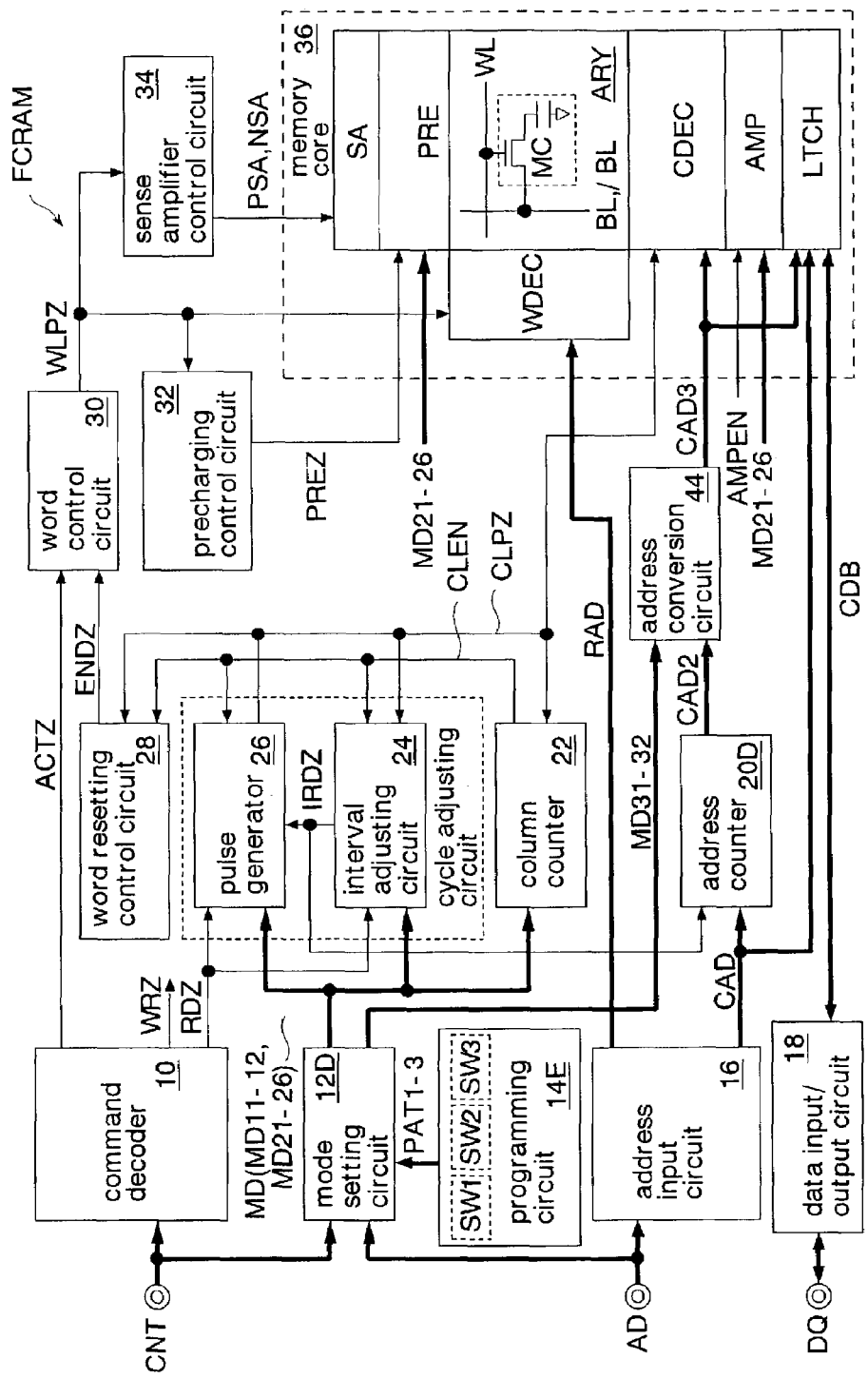
FIG. 27 is a block diagram showing a sixth embodiment of the present invention.

FIG. 27 shows a sixth embodiment of the semiconductor memory of the present invention. The same elements as those described in the first, second, and fifth embodiments will be designated by identical reference numbers or symbols. Detailed description thereof will be omitted here.

In this embodiment, a programming circuit 14E is formed instead of the programming circuit 14D of the fifth embodiment. The rest of the configuration is the same as in the fifth embodiment.

The programming circuit 14E has a first switch SW1, a second switch SW2, and a third switch SW3 which are made up of a conductive pattern formed on the semiconductor substrate in conformity to the pattern configuration of a photomask to be used in the semiconductor fabrication processes of the FCRAM. Since the functions of the first switch SW1 and the second switch SW2 are the same as in the second embodiment, description thereof will be omitted here.

The third switch SW3 outputs a pattern signal PAT3 (third internal setting signal) for indicating the operation mode of the FCRAM (low power mode or high speed mode). That is, the programming circuit 14E outputs the pattern signals PAT1, PAT2, and PAT3 according to the first, second, and third switches SW1, SW2, and SW3 which are set in accordance with the voltages of destinations of the conductive pattern.

The connection specifications of the first, second, and third switches SW1, SW2, and SW3, or the photomask to be used in fabricating the FCRAM, are determined in accordance with the product specifications (operating frequency, power consumption, etc.) of the FCRAM.

The mode setting circuit 12D is initialized in accordance with the logical levels of the pattern signals PAT1, PAT2, and PAT3 from the programming circuit 14E when the FCRAM is powered on. In the initial state, the number of times the column pulse CLPZ is output set at "4", and the generation cycle of the column pulses CLPZ (pulse width and pulse interval) is set at the maximum. The operation mode is set to the low power mode. As in the first and fifth embodiments, the mode setting circuit 12D can be re-set by a mode setting command.

As above, this embodiment can offer the same effects as those obtained from the first, second, and fifth embodiments described above.

Incidentally, the foregoing embodiments have dealt with the cases where the present invention is applied to an FCRAM. However, the present invention is not limited to such embodiments. For example, the present invention may be applied to a DRAM.

The invention is not limited to the above embodiments and various modifications may be made without departing from the spirit and scope of the invention. Any improvement may be made in part or all of the components.

What is claimed is:

1. A semiconductor memory comprising:
   a plurality of bit lines connected to memory cells, respectively;
   a plurality of column switches connected to said bit lines, respectively;
   a data bus line common to said bit lines, and connected to said bit lines through said column switches;
   a plurality of column selecting lines to be connected to said column switches, respectively;
   a pulse generator for generating an initial column pulse and generating a next column pulse in synchronization with a signal delayed from the initial column pulse, in response to a read command supplied from exterior;
   an address counter for receiving an external address supplied in association with said read command, and outputting said external address and addresses subsequent to said external address in succession as internal addresses; and
   a column decoder for successively selecting said column selecting lines in synchronization with said column pulses to turn on said column switches in succession, said column selecting lines corresponding to said internal addresses, respectively.

2. The semiconductor memory according to claim 1, comprising
   a first mode setting circuit for setting the number of said column pulses to be generated by said pulse generator.

3. The semiconductor memory according to claim 2, comprising
   a number control circuit for receiving a first mode signal which indicates the number of said column pulses said pulse generator output, and for outputting an enable signal until the indicated number of column pulses are all output, the first mode signal being output from said first mode setting circuit, and wherein
   said pulse generator generates said column pulses while said enable signal is output.

4. The semiconductor memory according to claim 2, wherein
   said first mode setting circuit sets the number of said column pulses, in accordance with a first setting signal supplied through an external terminal.

5. The semiconductor memory according to claim 4, comprising
   a first programming circuit for outputting a first internal setting signal to said first mode setting circuit, said first internal setting signal initially setting the number of said clock pulses to any one of a plurality of predetermined values in said first mode setting circuit.

6. The semiconductor memory according to claim 5, wherein
   said first programming circuit has a first fuse, for outputting said first internal setting signal in accordance with a programming of said first fuse.

7. The semiconductor memory according to claim 5, wherein
   said first programming circuit has a first switch which is made up of a conductive pattern, and outputs said first internal setting signal in accordance with a voltage at a destination of said conductive pattern, said conductive pattern being formed on a semiconductor substrate in conformity to a pattern configuration of a photomask which is used in a semiconductor fabrication process.

8. The semiconductor memory according to claim 2, comprising
   a second mode setting circuit for outputting a cycle setting signal indicating a cycle in which said column pulses are generated.

9. The semiconductor memory according to claim 8, comprising
   a cycle adjusting circuit for adjusting said cycle in accordance with said cycle setting signal.

10. The semiconductor memory according to claim 9, wherein
    said cycle adjusting circuit has a width adjusting circuit for adjusting a pulse width of each of said column pulses.

11. The semiconductor memory according to claim 9, wherein
    said cycle adjusting circuit has an interval adjusting circuit for adjusting a pulse interval of said column pulses.

12. The semiconductor memory according to claim 9, comprising
    a read amplifier for amplifying data on said data bus line, having higher amplification power when said cycle is short than when said cycle is long.

13. The semiconductor memory according to claim 9, comprising
    a precharging circuit for precharging said bit lines to a predetermined voltage, having higher drivability when said cycle is short than when said cycle is long.

14. The semiconductor memory according to claim 8, wherein
    said second mode setting circuit sets said cycle in accordance with a second setting signal supplied through an external terminal.

15. The semiconductor memory according to claim 14, comprising
    a second programming circuit for outputting a second internal setting signal to said second mode setting circuit, said second internal setting signal initially setting said cycle to any one of a plurality of predetermined values in said second mode setting circuit, said cycle being set in said second mode setting circuit.

16. The semiconductor memory according to claim 15, wherein said second programming circuit has a second fuse, and outputs said second internal setting signal in accordance with a programming of said second fuse.

17. The semiconductor memory according to claim 15, wherein
said second programming circuit has a second switch which is made up of a conductive pattern, and outputs said first internal setting signal in accordance with a voltage at a destination of said conductive pattern, said conductive pattern being formed on a semiconductor substrate in conformity with a pattern configuration of a photomask which is used in a semiconductor fabrication process.

18. The semiconductor memory according to claim 1, wherein
said column switches each have transistors with their gates connected to said bit lines, respectively, and either of their drains and sources connected to said data bus line.

19. The semiconductor memory according to claim 1, comprising:
a word line connected to said memory cells, and selected upon access to said memory cells; and
a word control circuit for deselecting said word line in response to a last one of said column pulses which are generated in response to said read command.

20. The semiconductor memory according to claim 19, comprising
a reset circuit for outputting a reset signal a predetermined time after the selection of said word line, the reset signal deselecting said word line, and wherein
said word control circuit deselects said word line in response to either of the last column pulse and said reset signal which arrives late.

21. The semiconductor memory according to claim 1, wherein said pulse generator sets a width of second and subsequent ones of said column pulses to a value smaller than a width of a first one of said column pulses.

22. The semiconductor memory according to claim 1, comprising a precharging control circuit for starting precharging said bit lines in response to the last one of said column pulses.

23. The semiconductor memory according to claim 1, further comprising
a latch circuit connected to said data bus line, for latching, in response to said read command, read data successively transmitted through said bit lines.

24. The semiconductor memory according to claim 1, comprising:
a plurality of memory blocks each having said bit lines, said column switches, said data bus line, and said column selecting lines;
a third mode setting circuit for setting an operation mode of the semiconductor memory to one of a low power mode and a high speed mode; and
an address conversion circuit for converting said internal addresses into second internal addresses in accordance with a set value in said third mode setting circuit, and wherein
the number of said memory blocks designated by said second internal addresses during said low power mode is smaller than during said high speed mode, said second internal addresses being output from said address conversion circuit.

25. The semiconductor memory according to claim 24, wherein
said third mode setting circuit sets one of said low power mode and said high speed mode in accordance with a third setting signal supplied through an external terminal.

26. The semiconductor memory according to claim 24, comprising
a third programming circuit for outputting a third internal setting signal to said third mode setting circuit, the third internal setting signal initially setting a setting of said third mode setting circuit to one of said low power mode and said high speed mode.

27. The semiconductor memory according to claim 26, wherein said third programming circuit has a third fuse, and outputs said third internal setting signal in accordance with a programming of said third fuse.

28. The semiconductor memory according to claim 26, wherein
said third programming circuit has a third switch which is made up of a conductive pattern, and outputs said third internal setting signal in accordance with a voltage at a destination of said conductive pattern, the conductive pattern being formed on a semiconductor substrate in conformity to a pattern configuration of a photomask which is used in a semiconductor fabrication process.

* * * * *